(12) United States Patent
Jobetto

(10) Patent No.: US 8,237,277 B2
(45) Date of Patent: Aug. 7, 2012

(54) SEMICONDUCTOR DEVICE PROVIDED WITH TIN DIFFUSION INHIBITING LAYER, AND MANUFACTURING METHOD OF THE SAME

(75) Inventor: Hiroyasu Jobetto, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 13/069,771

(22) Filed: Mar. 23, 2011

(65) Prior Publication Data

US 2011/0233769 A1    Sep. 29, 2011

(30) Foreign Application Priority Data

Mar. 23, 2010  (JP) .................................. 2010-066190
Mar. 25, 2010  (JP) .................................. 2010-070524

(51) Int. Cl.
*H01L 23/485*       (2006.01)

(52) U.S. Cl. ........ 257/737; 257/738; 257/741; 257/750; 257/751; 257/E23.021

(58) Field of Classification Search .................. 257/737, 257/738, 741, 750, 751, E22.021
See application file for complete search history.

(56) References Cited

FOREIGN PATENT DOCUMENTS
WO      WO 03/012863 A1    2/2003

*Primary Examiner* — Long Pham
(74) *Attorney, Agent, or Firm* — Holtz, Holtz, Goodman & Chick, PC

(57) ABSTRACT

A semiconductor device is disclosed wherein a tin diffusion inhibiting layer is provided above the land of a wiring line, and a solder ball is provided above the tin diffusion inhibiting layer. Thus, even when this semiconductor device is, for example, a power supply IC which deals with a high current, the presence of the tin diffusion inhibiting layer makes it possible to more inhibit the diffusion of tin in the solder ball into the wiring line.

9 Claims, 25 Drawing Sheets

SEMICONDUCTOR DEVICE PROVIDED WITH TIN DIFFUSION INHIBITING LAYER, AND MANUFACTURING METHOD OF THE SAME

CROSS-REFERENCE TO RELATED APPLICATIONS

This application is based upon and claims the benefit of priority from prior Japanese Patent Applications No. 2010-066190, filed Mar. 23, 2010; and No. 2010-070524, filed Mar. 25, 2010, the entire contents of both of which are incorporated herein by reference.

BACKGROUND OF THE INVENTION

1. Field of the Invention

The present invention relates to a semiconductor device provided with a tin diffusion inhibiting layer, and a manufacturing method of the same.

2. Description of the Related Art

According to WO 2003/012863, a solder ball is provided on the land of a wiring line provided on a semiconductor substrate. In this case, a plated film made of, for example, nickel is provided on the upper surface of the land of the wiring line made of copper in order to reduce contact resistance and promote the reactivity of solder. The solder ball is provided on the upper surface of the plated film.

In the meantime, although WO 2003/012863 does not describe any method of forming the plated film, parts other than the land of the wiring line are covered with an overcoat film, and the plated film smaller in thickness than the overcoat film is formed on the upper surface of the land of the wiring line within an opening formed in the overcoat film in the part of the wiring line corresponding to the land. It is therefore presumed that the plated film is formed by electroless plating.

If tin in the solder ball diffuses into the wiring line made of copper, a fragile alloy layer made of tin and copper is formed or a void is generated in the wiring line, such that the wiring line tends to be broken. Accordingly, if the plated film made of, for example, nickel is formed on the upper surface of the land of the wiring line, the plated film functions as a tin diffusion inhibiting layer.

However, in a semiconductor device such as a power supply IC which deals with a high current, the velocity of the diffusion of tin in the solder ball into the wiring line is significantly increased by an electromigration phenomenon. On the other hand, if the plated film is formed by the electroless plating, the thickness of the plated film is relatively small and is as thick as 5 μm or less owing to the characteristics of the electroless plating. In the case of sputtering, the thickness of the plated film is about 2000 to 5000 Å (0.2 to 0.5 μm). Thus, the problem of a semiconductor device such as the power supply IC which deals with a high current is that a tin diffusion inhibiting function cannot be said to be enough even if the plated film is formed on the upper surface of the land of the wiring line by the electroless plating.

BRIEF SUMMARY OF THE INVENTION

It is therefore an object of the present invention to provide a semiconductor device and a manufacturing method of the same wherein the diffusion of tin in a solder ball to a metal layer or a wiring line thereunder can be more inhibited and stress on the solder ball can be more eased.

According to one aspect of the present invention, there is provided a semiconductor device comprising: a semiconductor substrate; a wiring line provided on the semiconductor substrate via an insulating film; a tin diffusion inhibiting layer provided above the wiring line; and a solder bump provided on the tin diffusion inhibiting layer, wherein the melting point of the tin diffusion inhibiting layer is higher than the melting point of the solder bump.

According to another aspect of the present invention, there is provided a semiconductor device comprising: a semiconductor substrate; a wiring line provided on the semiconductor substrate via an insulating film; a tin diffusion inhibiting layer provided above the wiring line; an oxidation inhibiting layer provided on the tin diffusion inhibiting layer; and a solder ball mounted on the oxidation inhibiting layer, wherein the oxidation inhibiting layer is formed before the solder ball is mounted.

According to still another aspect of the present invention, there is provided a semiconductor device manufacturing method comprising: heating a conductive paste at a predetermined temperature to form a tin diffusion inhibiting layer on a wiring line provided on a semiconductor substrate comprising an insulating film in which the wiring line is formed, the tin diffusion inhibiting layer being not remelted at the predetermined temperature; and forming a solder ball on the tin diffusion inhibiting layer.

According to still another aspect of the present invention, there is provided a semiconductor device manufacturing method comprising: forming a tin diffusion inhibiting layer on a land of a wiring line upper metal layer formed via an insulating film on a semiconductor substrate; forming, on the tin diffusion inhibiting layer, an oxidation inhibiting layer which inhibits oxidation of the tin diffusion inhibiting layer; and forming a solder ball on the oxidation inhibiting layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION (First Embodiment)

Figure 1:
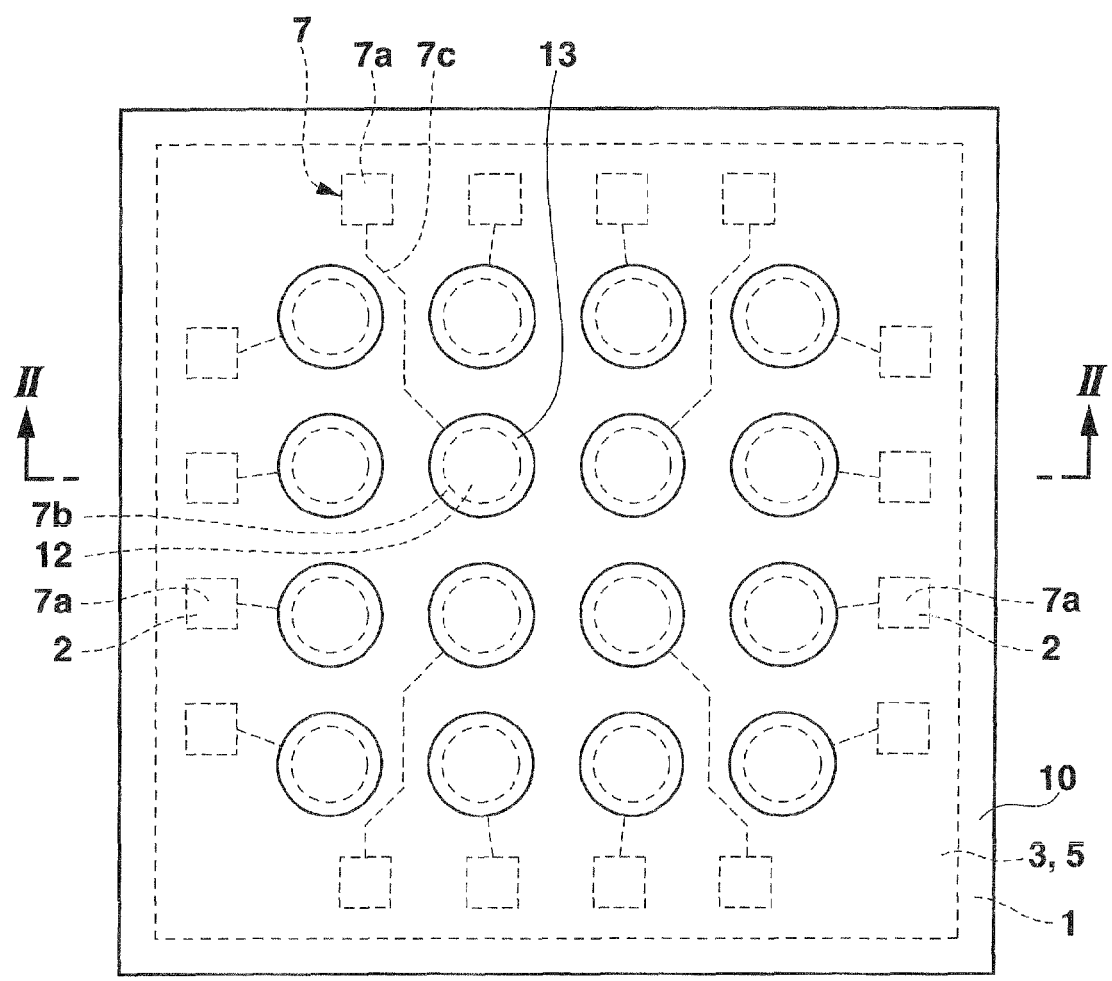
FIG. 1 is a plan view of a semiconductor device according to a first embodiment of the present invention.
Figure 2:
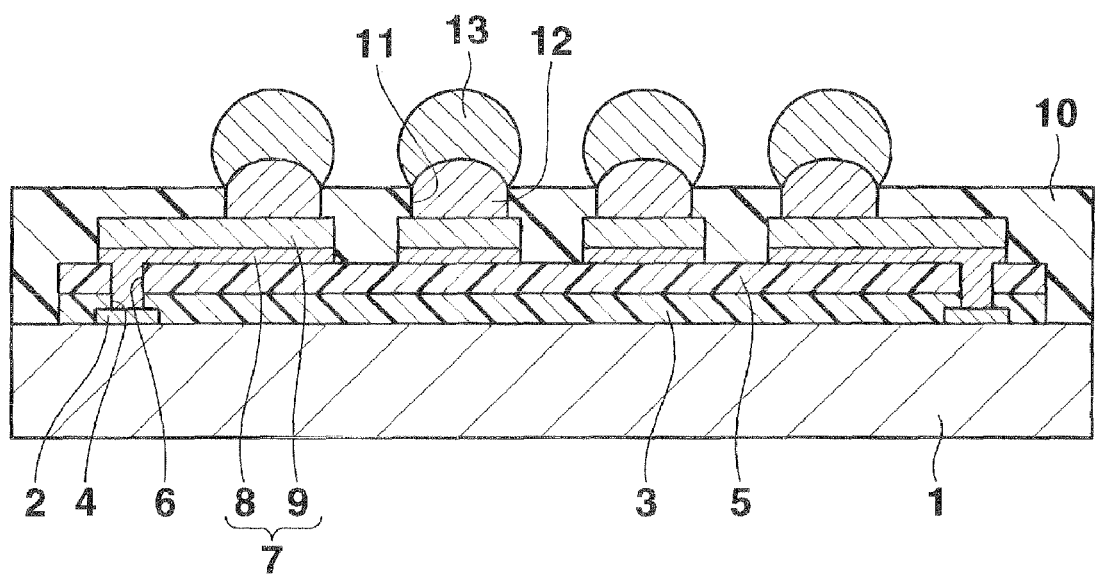
FIG. 2 is a sectional view of a part substantially taken along the line II-II of FIG. 1.

FIG. 1 shows a plan view of a semiconductor device according to a first embodiment of this invention. FIG. 2 shows a sectional view of a part substantially taken along the line II-II of FIG. 1. This semiconductor device is generally called a chip size package (CSP), and comprises a silicon substrate (semiconductor substrate) 1 having a square planar shape. Although not shown, elements that constitute an integrated circuit having a predetermined function, such as a transistor, a diode, a resistor, and a condenser are formed on the upper surface of the silicon substrate 1. Connection pads 2 made of, for example, an aluminum-based metal and connected to the elements of the integrated circuit are provided in the circumferential part of the upper surface of the silicon substrate 1.

A passivation film (insulating film) 3 made of, for example, silicon oxide is provided on the upper surface of the silicon substrate 1 except for the circumferential part of the silicon substrate 1 and the centers of the connection pads 2. The center of the connection pad 2 is exposed via an opening 4 provided in the passivation film 3. A protective film (insulating film) 5 made of, for example, a polyimide resin is provided on the upper surface of the passivation film 3. An opening 6 is provided in a part of the protective film 5 corresponding to the opening 4 of the passivation film 3.

Wiring lines 7 are provided on the upper surface of the protective film 5. The wiring line 7 has a two-layer structure composed of a foundation metal layer 8 made of, for example, copper and provided on the upper surface of the protective film 5, and an upper metal layer 9 made of copper and provided on the upper surface of the foundation metal layer 8. One end of the wiring line 7 is connected to the connection pad 2 via the openings 4 and 6 of the passivation film 3 and the protective film 5. Here, as shown in FIG. 1, the wiring line 7 comprises an end 7a connected to the connection pad 2, a land 7b having a circular planar shape, and an extension line 7c therebetween. Thus, the lands 7b of the wiring lines 7 are arranged in matrix form on the upper surface of the protective film 5.

An overcoat film 10 made of, for example, a polyimide resin or a solder resist is provided in parts other than the lands 7b of the wiring lines 7 on the upper surface of the circumferential part of the silicon substrate 1 and on the upper surface of the protective film 5 including the wiring line 7. In this condition, an opening 11 having a circular planar shape is provided in a part of the overcoat film 10 corresponding to the land 7b of the wiring line 7.

A tin diffusion inhibiting layer 12 having a circular planar shape and having a dome shape is provided on the upper surface of the land 7b of the wiring line 7 within the opening 11 of the overcoat film 10. The tin diffusion inhibiting layer 12 is made of a melting point rising type solder which is melted into a solid state at a heating temperature of 180° C. or more and 280° C. or less used during later-described reflow and which is then not remelted at the same heating temperature of 180° C. or more and 280° C. or less. Specifically, the tin diffusion inhibiting layer 12 is made of a tin-copper-based lead-free solder having a high copper content and having a noneutectic composition.

A solder ball (solder bump) 13 is provided on the upper surface of the tin diffusion inhibiting layer 12. The solder ball 13 is made of a melting point non-rising type solder which is melted into a solid state at a heating temperature of 180° C. or more and 280° C. or less used during the later-described reflow and which is then remelted at the same heating temperature of 180° C. or more and 280° C. or less. Specifically, the solder ball 13 is made of a tin-silver-based lead-free solder having a eutectic composition.

Figure 3:
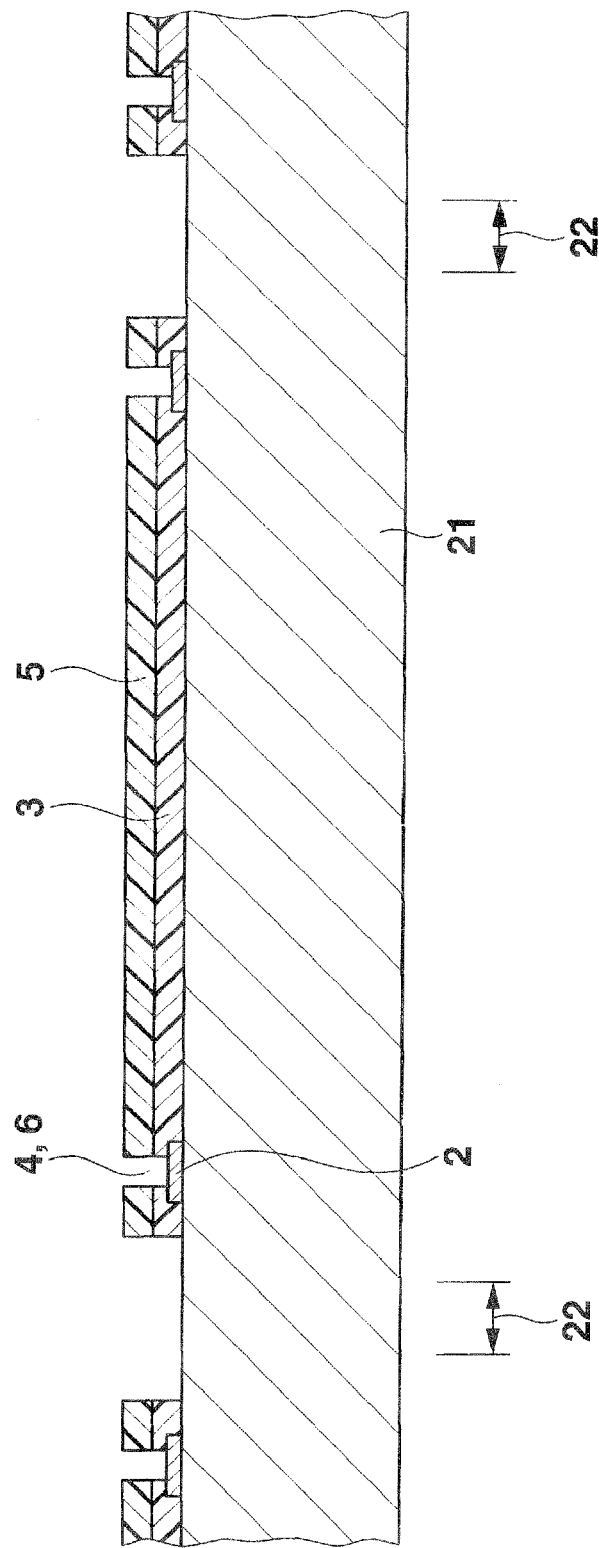
FIG. 3 is a sectional view of an initially prepared assembly in one example of a method of manufacturing the semiconductor device shown in FIG. 1 and FIG. 2.

Now, one example of a method of manufacturing this semiconductor device is described. First, as shown in FIG. 3, an assembly is prepared. In this assembly, connection pads 2 made of, for example, an aluminum-based metal, a passivation film 3 made of, for example, silicon oxide, and a protective film 5 made of, for example, a polyimide resin are formed on the upper surface of a silicon substrate in a wafer state (hereinafter referred to as a semiconductor wafer 21). The centers of the connection pads 2 are exposed through openings 4 and 6 of the passivation film 3 and the protective film 5.

In this case, the thickness of the semiconductor wafer 21 is greater than the thickness of a silicon substrate 1 shown in FIG. 2. In FIG. 3, zones indicated by the sign 22 are dicing streets. The parts of the passivation film 3 and the protective film 5 corresponding to the dicing street 22 and both its sides are removed.

Figure 4:
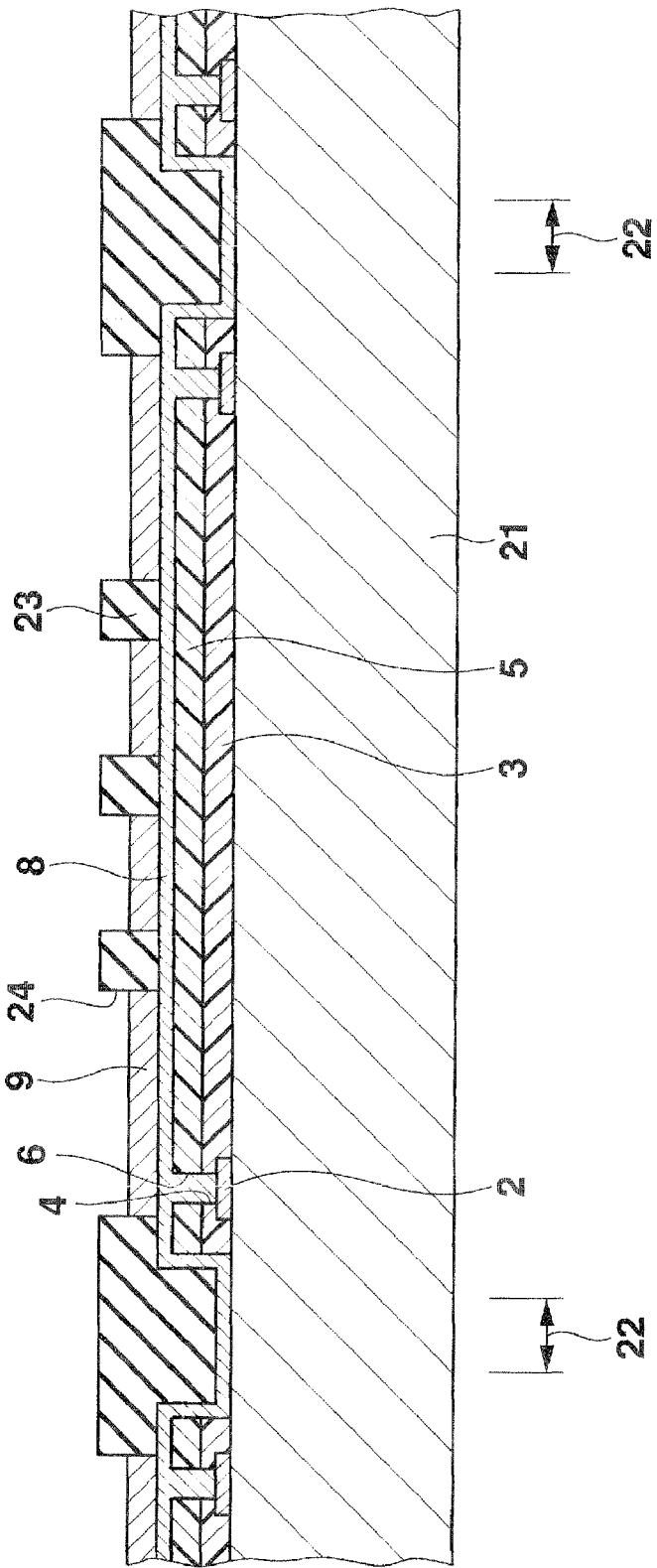
FIG. 4 is a sectional view of a step following FIG. 3.

Then, as shown in FIG. 4, a foundation metal layer 8 is formed on the upper surface of the first insulating film 5 including the upper surface of the connection pad 2 exposed through the openings 4 and 6 of the passivation film 3 and the first insulating film 5, and on parts of the upper surface of the semiconductor wafer 21 corresponding to the dicing street 22 and both its sides. In this case, the foundation metal layer 8 may only be a copper layer formed by electroless plating, may only be a copper layer formed by sputtering, or may be a copper layer formed by sputtering on a thin film layer of, for example, titanium formed by sputtering.

Then, a plating resist film 23 made of a positive liquid resist is patterned/formed on the upper surface of the foundation metal layer 8. In this case, an opening 24 is formed in a part of the plating resist film 23 corresponding to a region where an upper metal layer 9 is to be formed. Further, electrolytic plating with copper is carried out using the foundation metal layer 8 as a plating current path, thereby forming the upper metal layer 9 on the upper surface of the foundation metal layer 8 within the opening 24 of the plating resist film 23.

Figure 5:
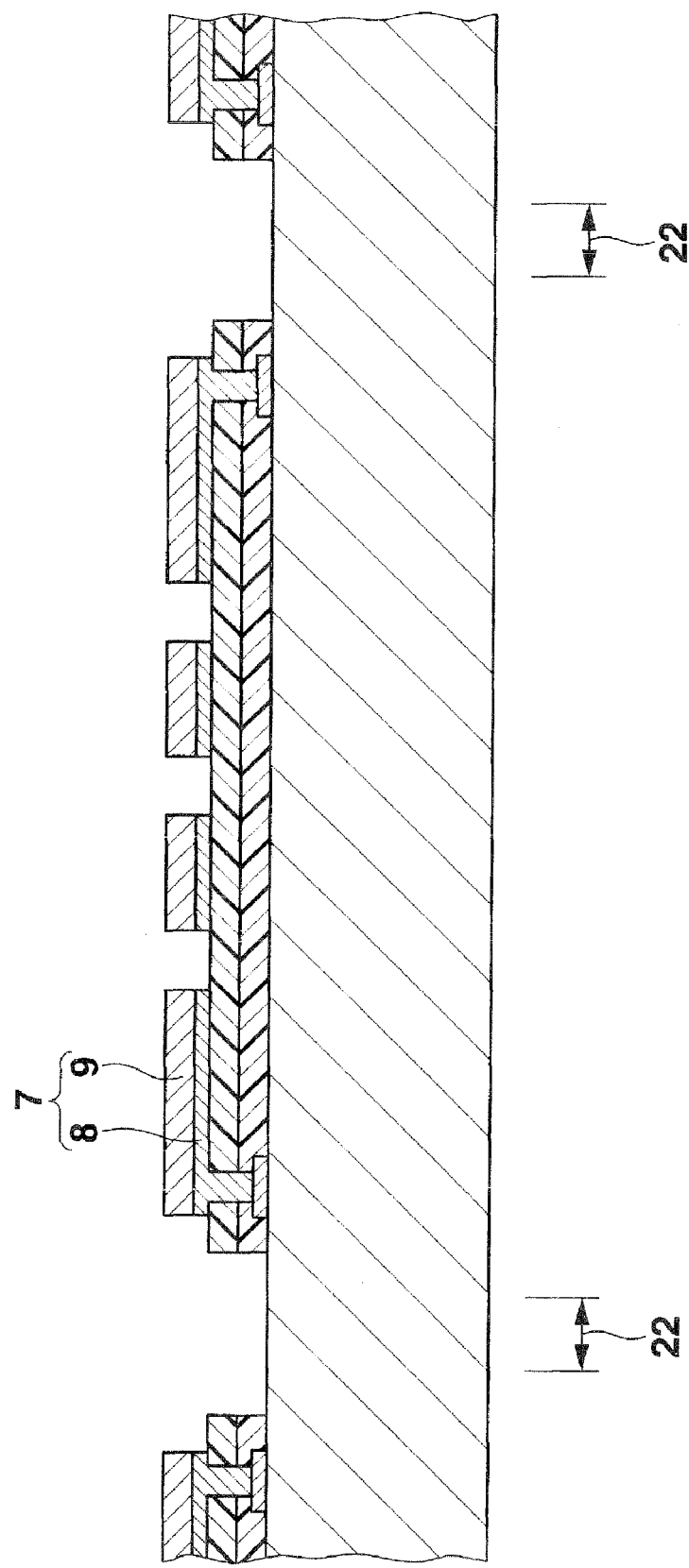
FIG. 5 is a sectional view of a step following FIG. 4.

Then, the plating resist film 23 is released. Further, using the upper metal layer 9 as a mask, the foundation metal layer 8 located in a part other than a part under the upper metal layer 9 is etched and removed. Thus, as shown in FIG. 5, the foundation metal layer 8 remains under the upper metal layer 9 alone. In this state, a wiring line 7 having a double-layer structure is formed by the upper metal layer 9 and the foundation metal layer 8 remaining thereunder.

Figure 6:
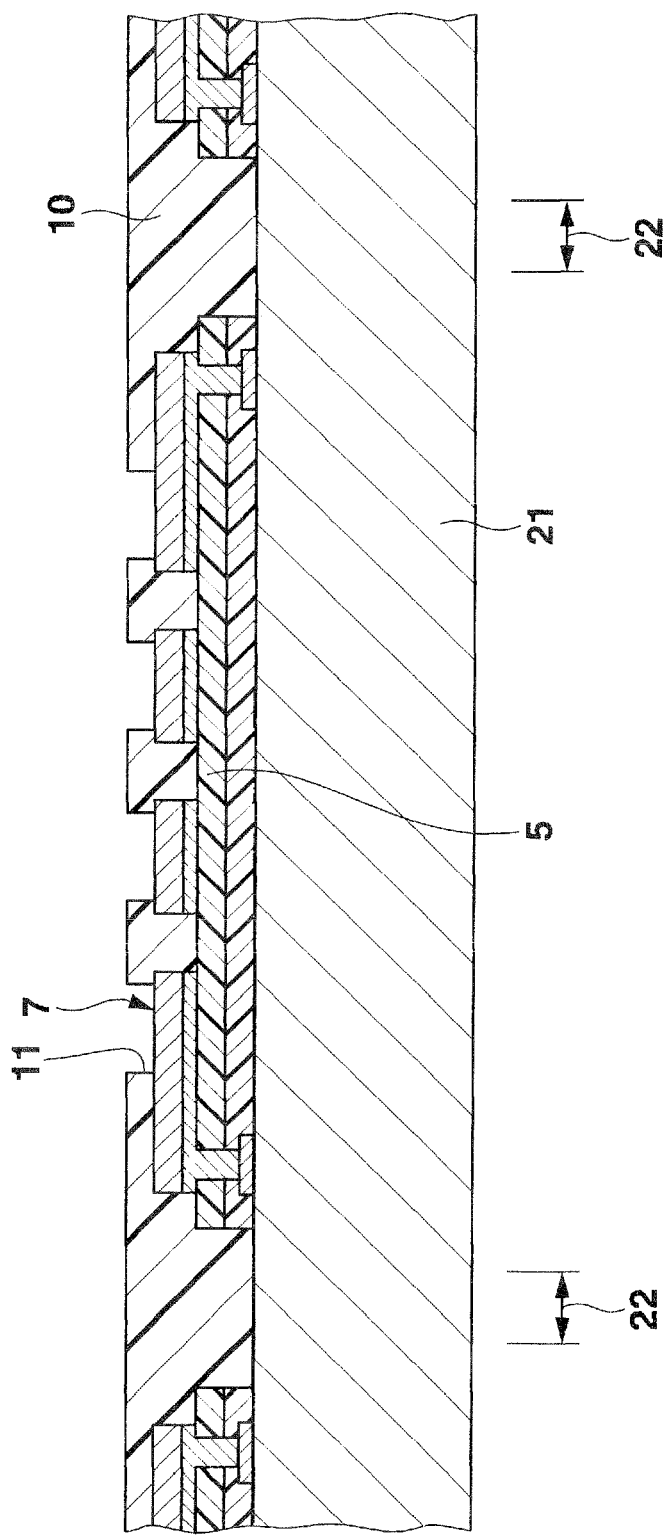
FIG. 6 is a sectional view of a step following FIG. 5.

Then, as shown in FIG. 6, an overcoat film 10 made of, for example, a polyimide resin or a solder resist is formed by, for example, a spin coat method or a printing method on the upper surface of the semiconductor wafer 21 corresponding to the dicing street 22 and both its sides and on the upper surface of the first insulating film 5 including the wiring line 7. Further, an opening 11 having a circular planar shape is formed by laser processing in which a laser beam is applied or by a photolithographic method in a part of the overcoat film 10 corresponding to a land 7b of the wiring line 7.

Figure 7:
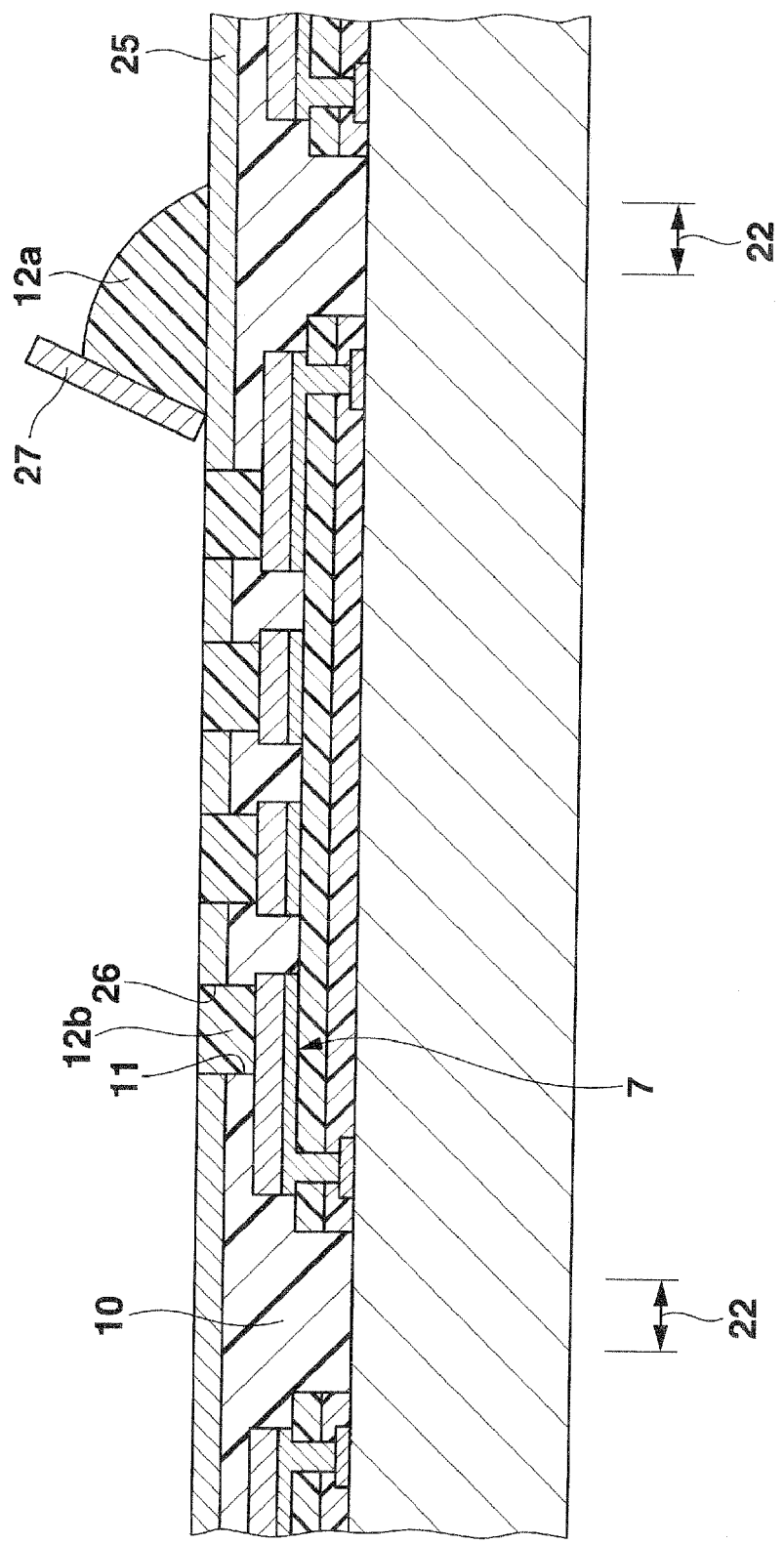
FIG. 7 is a sectional view of a step following FIG. 6.

Then, as shown in FIG. 7, a solder paste printing mask 25 is disposed on the overcoat film 10. In this case, an opening 26 is formed in a part of the solder paste printing mask 25 corresponding to the opening 11 of the overcoat film 10. Further, a solder paste 12a is printed on the upper surface of the land 7b of the wiring line 7 within the openings 26 and 11 of the solder paste printing mask 25 and the overcoat film 10 by a screen printing method which moves a squeegee 27 on the solder paste printing mask 25. A solder paste layer 12b is then formed.

In this case, the solder paste 12a is made of a melting point rising type solder which is melted into a solid state at a heating temperature of 180° C. or more and 280° C. or less used during later-described reflow and which is then not remelted at the same heating temperature of 180° C. or more and 280° C. or less. Specifically, the solder paste 12a is made of a tin-copper-based lead-free solder having a high copper content and having a noneutectic composition. More specifically, the solder paste 12a is made of a solder paste which is formed into a paste state by dispersing tin particles and copper particles having a particle diameter of about 15 μm into a flux.

Figure 8:
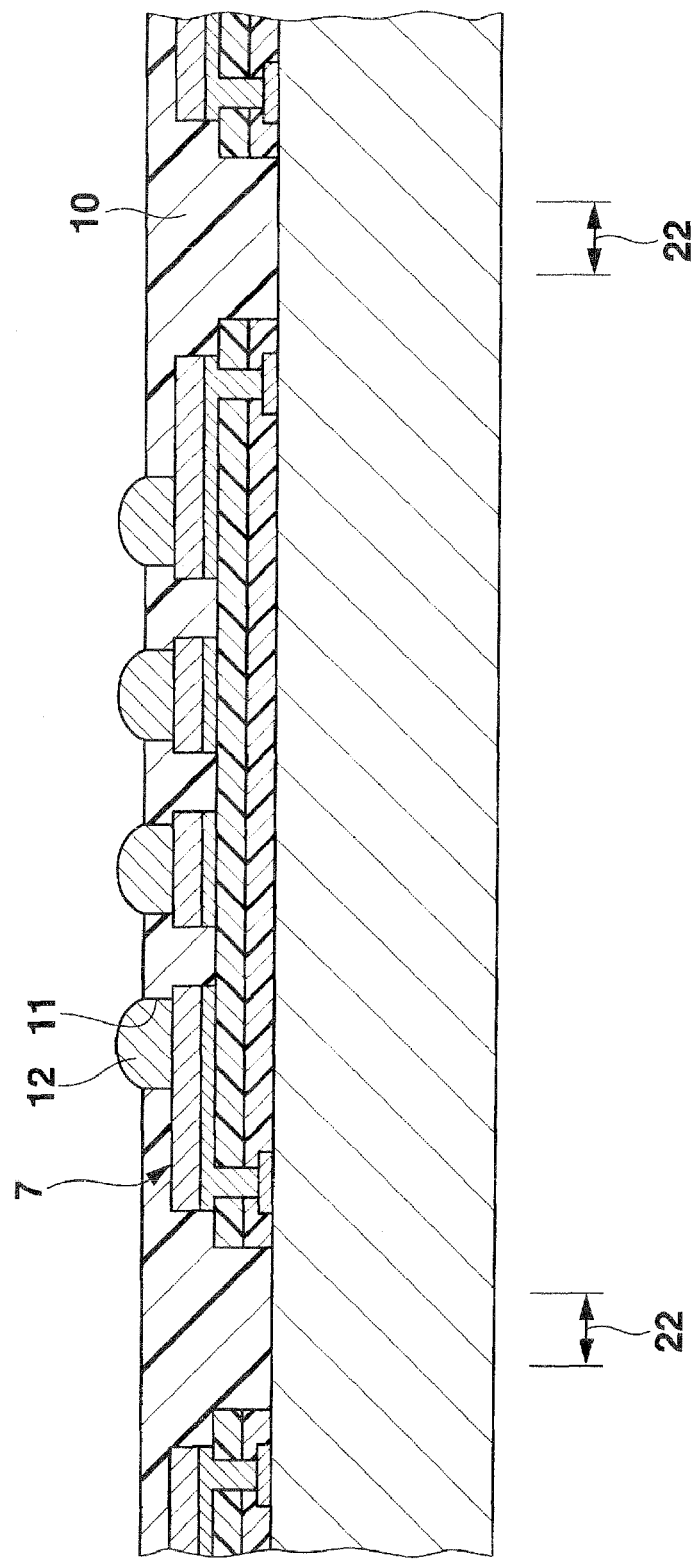
FIG. 8 is a sectional view of a step following FIG. 7.

Then, as shown in FIG. 8, if reflow is carried out at a heating temperature of 180° C. or more and 280° C. or less, a tin diffusion inhibiting layer 12 having a circular planar shape and having a dome shape is formed on the upper surface of the land 7b of the wiring line 7 within the opening 11 of the overcoat film 10. In this case, the flux in the solder paste layer 12b evaporates, and the tin particles in the solder paste layer 12b are only melted but the copper particles having a high melting point are not melted. Further, the copper particles react with melted tin, and a copper-tin alloy (Cu6Sn5) is generated. As a result, the tin diffusion inhibiting layer 12 is a mixture of the copper-tin alloy, tin, and copper, and will not be remelted in the future even if heated at a heating temperature of 180° C. or more and 280° C. or less.

Here, the thickness of the wiring line 7 is about 5 μm by way of example. The thickness of the overcoat film 10 on the wiring line 7 is 5 to 10 μm. The maximum height of the tin diffusion inhibiting layer 12 can be much greater than the thickness of a plated film formed by electroless plating which is 5 μm or less. The maximum height of the tin diffusion inhibiting layer 12 is about 50 μm.

Figure 9:
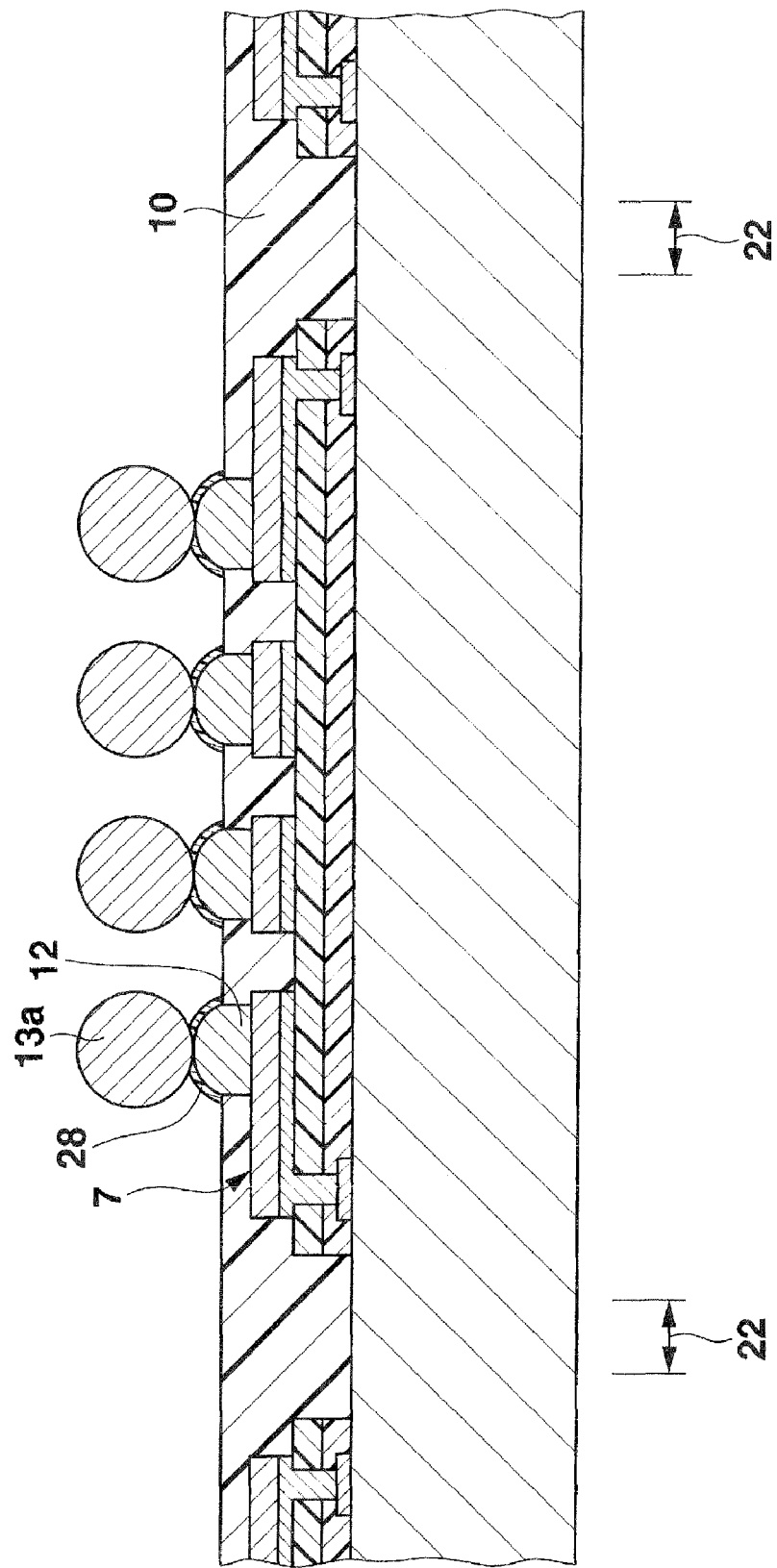
FIG. 9 is a sectional view of a step following FIG. 8.
Figure 10:
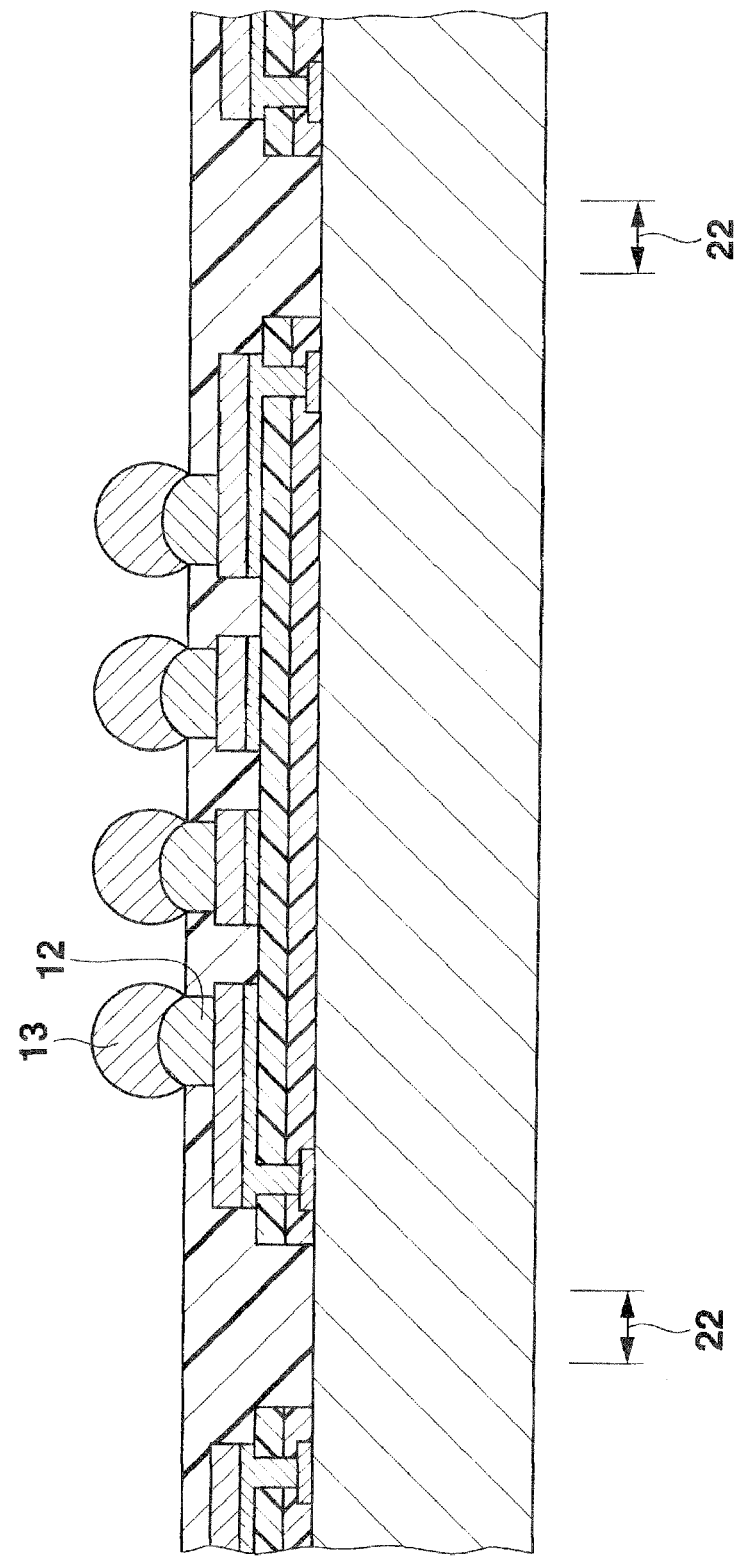
FIG. 10 is a sectional view of a step following FIG. 9.

Then, as shown in FIG. 9, a flux 28 is printed by the screen printing method on the tin diffusion inhibiting layer 12 and on the overcoat film 10 around the tin diffusion inhibiting layer 12. A solder ball 13a is mounted on the flux 28. In this case, the solder ball 13a is made of a melting point non-rising type solder which is melted into a solid state at a heating temperature of 180° C. or more and 280° C. or less used during the later-described reflow and which is then remelted at the same heating temperature of 180° C. or more and 280° C. or less. Specifically, the solder ball 13a is made of a tin-silver-based lead-free solder having a eutectic composition. Further, the reflow is carried out at a heating temperature of 180° C. or more and 280° C. or less. As a result, the flux 28 evaporates, and the solder ball 13a is melted and then solidified, so that a solder ball 13 is formed on the tin diffusion inhibiting layer 12, as shown in FIG. 10.

In this case, the tin diffusion inhibiting layer 12 is not remelted at a heating temperature of 180° C. or more and 280° C. or less used during the reflow for forming the solder ball 13, and maintains the dome shape. The solder ball 13 may otherwise be formed by printing a solder paste on the tin diffusion inhibiting layer 12 in accordance with the screen printing method and then causing the reflow of the solder paste at a heating temperature of 180° C. or more and 280° C. or less.

Figure 11:
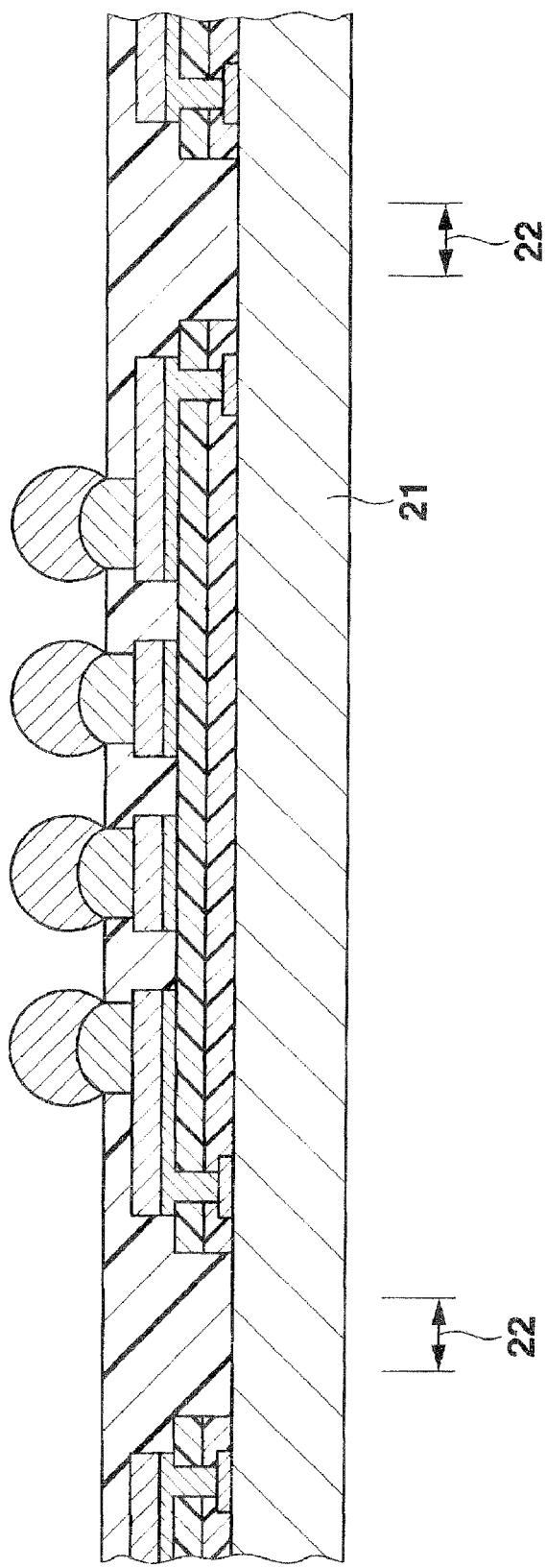
FIG. 11 is a sectional view of a step following FIG. 10.
Figure 12:
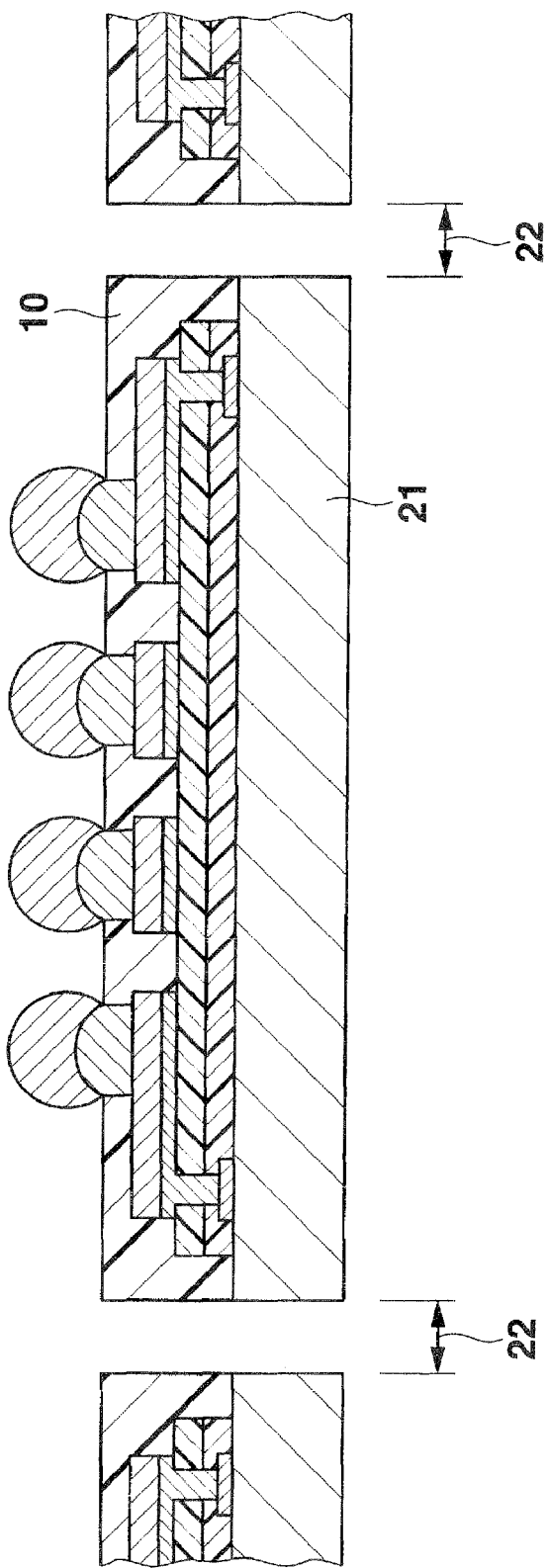
FIG. 12 is a sectional view of a step following FIG. 11.

Then, as shown in FIG. 11, the lower side of the semiconductor wafer 21 is properly ground to reduce the thickness of the semiconductor wafer 21. Further, as shown in FIG. 12, the overcoat film 10 and the semiconductor wafer 21 are cut along the dicing streets 22, thereby obtaining the semiconductor devices shown in FIG. 1 and FIG. 2.

In the semiconductor device thus obtained, the tin diffusion inhibiting layer 12 is formed on the land 7b of the wiring line 7, and the solder ball 13 is formed on the tin diffusion inhibiting layer 12. Thus, even when this semiconductor device is, for example, a power supply IC which deals with a high current, the presence of the tin diffusion inhibiting layer 12 makes it possible to more inhibit the diffusion of tin in the solder ball 13 into the wiring line 7 thereunder.

Furthermore, in this semiconductor device, the maximum height of the tin diffusion inhibiting layer 12 having a dome shape can be much greater than the thickness of a plated film formed by electroless plating which is 5 μm or less, and can be, for example, about 50 μm. As a result, the tin diffusion inhibiting layer 12 has a dome shape, and the maximum height thereof can be relatively great, so that stress on the solder ball 13 is dispersed in the height direction of the tin diffusion inhibiting layer 12, and the stress on the solder ball can be more eased.

Furthermore, in the semiconductor device manufacturing method, the solder paste 12a is printed on the land 7b of the wiring line 7 by the screen printing method to carry out the reflow in forming the tin diffusion inhibiting layer 12 having a dome shape. Thus, the process cost can be reduced as compared with the case where the tin diffusion inhibiting layer 12 is formed by use of the plating resist film.

Figure 13:
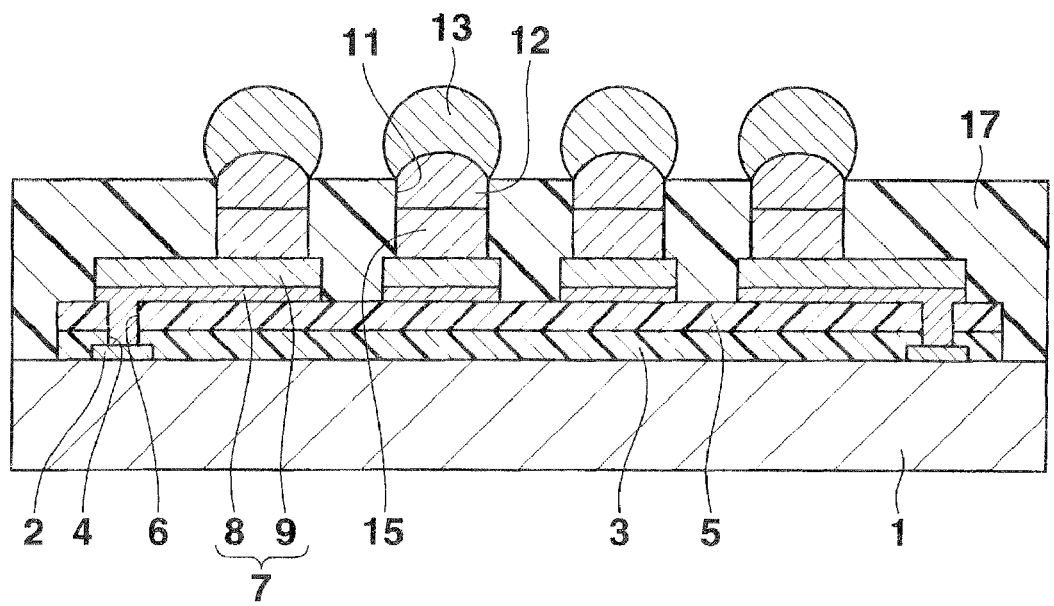
FIG. 13 is a sectional view of the other example of the semiconductor device according to a first embodiment of the present invention.

Although the tin diffusion inhibiting layer 12 is formed by the melting point rising type solder paste in the embodiment described above, the tin diffusion inhibiting layer 12 is not exclusively formed thereby. The material for the tin diffusion inhibiting layer 12 has only to be a metal paste which is not remelted at the heating temperature during the formation of the layer. For example, a copper paste produced by dispersing copper particles into a paste made of, for example, a thermosetting resin may be printed by the screen printing method and burned at a heating temperature of about 150° C. to form the tin diffusion inhibiting layer 12. Moreover, although the tin diffusion inhibiting layer 12 is directly formed on the land 7b of the wiring line 7 in the embodiment described above, the tin diffusion inhibiting layer 12 is not exclusively formed in this manner. For example, as shown in FIG. 13, a columnar electrode (copper layer) 15 may be formed on the land 7b of the wiring line 7, and the tin diffusion inhibiting layer 12 may be formed on the columnar electrode 15.

(Second Embodiment)

Figure 14:
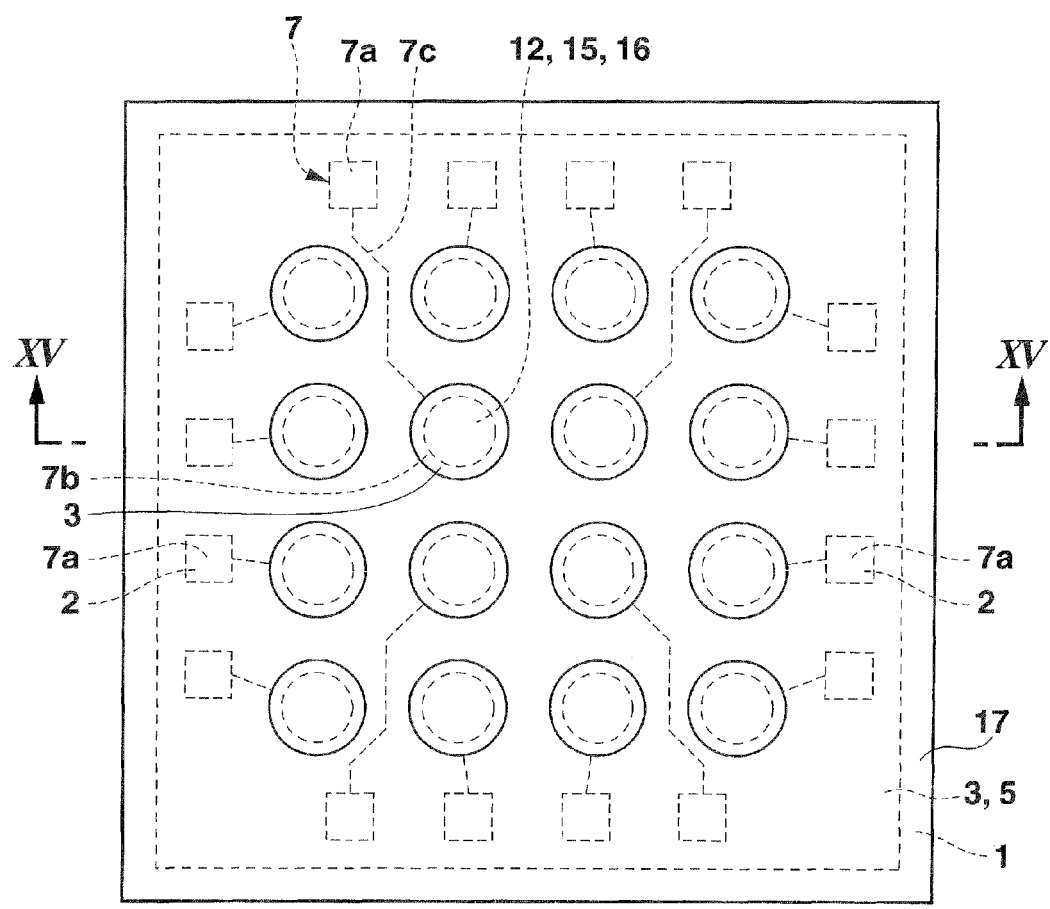
FIG. 14 is a plan view of a semiconductor device according to a second embodiment of the present invention.
Figure 15:
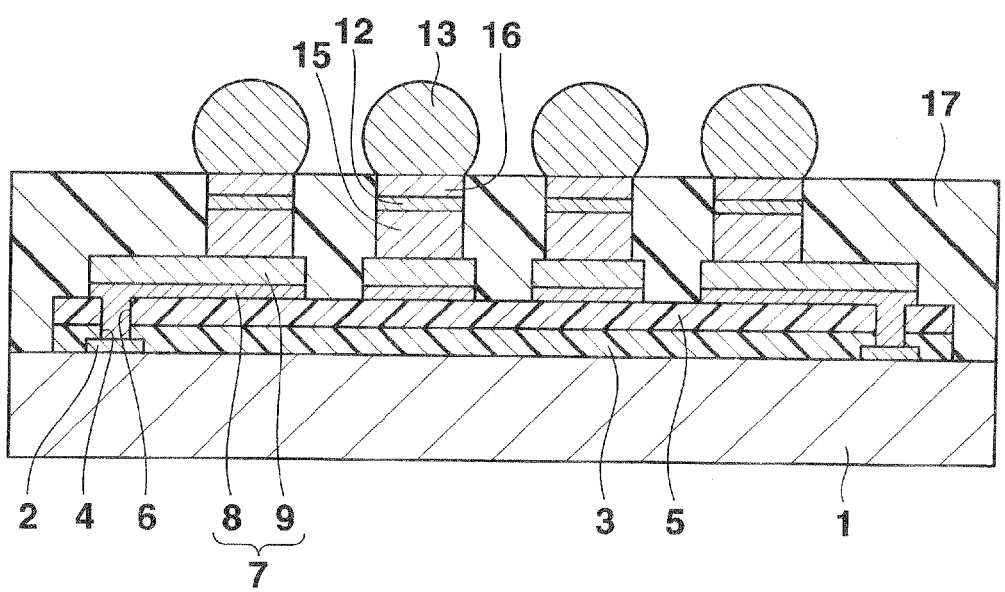
FIG. 15 is a sectional view of a part substantially taken along the line XIV-XIV of FIG. 14.

FIG. 14 shows a plan view of a semiconductor device according to a second embodiment of the present invention. FIG. 15 shows a sectional view of a part substantially taken along the line XIV-XIV of FIG. 14. This semiconductor device is generally called a chip size package (CSP), and comprises a silicon substrate (semiconductor substrate) 1 having a square planar shape. Although not shown, elements that constitute an integrated circuit having a predetermined function, such as a transistor, a diode, a resistor, and a condenser are formed on the upper surface of the silicon substrate 1. Connection pads 2 made of, for example, an aluminum-based metal and connected to the elements of the integrated circuit are provided in the circumferential part of the upper surface of the silicon substrate 1.

A passivation film (insulating film) 3 made of, for example, silicon oxide is provided on the upper surface of the silicon substrate 1 except for the circumferential part of the silicon substrate 1 and the centers of the connection pads 2. The center of the connection pad 2 is exposed via an opening 4 provided in the passivation film 3. A protective film (insulating film) 5 made of, for example, a polyimide resin is provided on the upper surface of the passivation film 3. An opening 6 is provided in a part of the protective film 5 corresponding to the opening 4 of the passivation film 3.

Wiring lines 7 are provided on the upper surface of the protective film 5. The wiring line 7 has a two-layer structure composed of a foundation metal layer 8 made of, for example, copper and provided on the upper surface of the protective film 5, and an upper metal layer 9 made of copper and provided on the upper surface of the foundation metal layer 8. One end of the wiring line 7 is connected to the connection pad 2 via the openings 4 and 6 of the passivation film 3 and the protective film 5.

Here, as shown in FIG. 14, the wiring line 7 comprises an end 7a connected to the connection pad 2, a land 7b having a circular planar shape and serving as a seat for a columnar electrode (copper layer) 15 described later, and an extension line 7c therebetween. Thus, the lands 7b of the wiring lines 7 are arranged in matrix form on the upper surface of the protective film 5.

The columnar electrode 15 made of copper and having a circular planar shape, a tin diffusion inhibiting layer 12 made of nickel, and an oxidation inhibiting layer 16 made of solder are provided in this order on the upper surface of the land 7b of the wiring line 7. A sealing film 17 made of an epoxy resin containing a silica filler is provided around the columnar electrode 15, the tin diffusion inhibiting layer 12, and the oxidation inhibiting layer 16 on the upper surface of the circumferential part of the silicon substrate 1 and on the upper surface of the protective film 5 including the wiring line 7. Here, the oxidation inhibiting layer 16 is provided so that the upper surface thereof is flush with or is 1 to 2 μm lower than the upper surface of the sealing film 17. A solder ball 13 is provided on the upper surface of the oxidation inhibiting layer 16.

Now, one example of a method of manufacturing this semiconductor device is described. First, as shown in FIG. 3, an assembly is prepared. In this assembly, connection pads 2 made of, for example, an aluminum-based metal, a passivation film 3 made of, for example, silicon oxide, and a protective film 5 made of, for example, a polyimide resin are formed on the upper surface of a silicon substrate in a wafer state (hereinafter referred to as a semiconductor wafer 21). The centers of the connection pads 2 are exposed through openings 4 and 6 of the passivation film 3 and the protective film 5.

Figure 16:
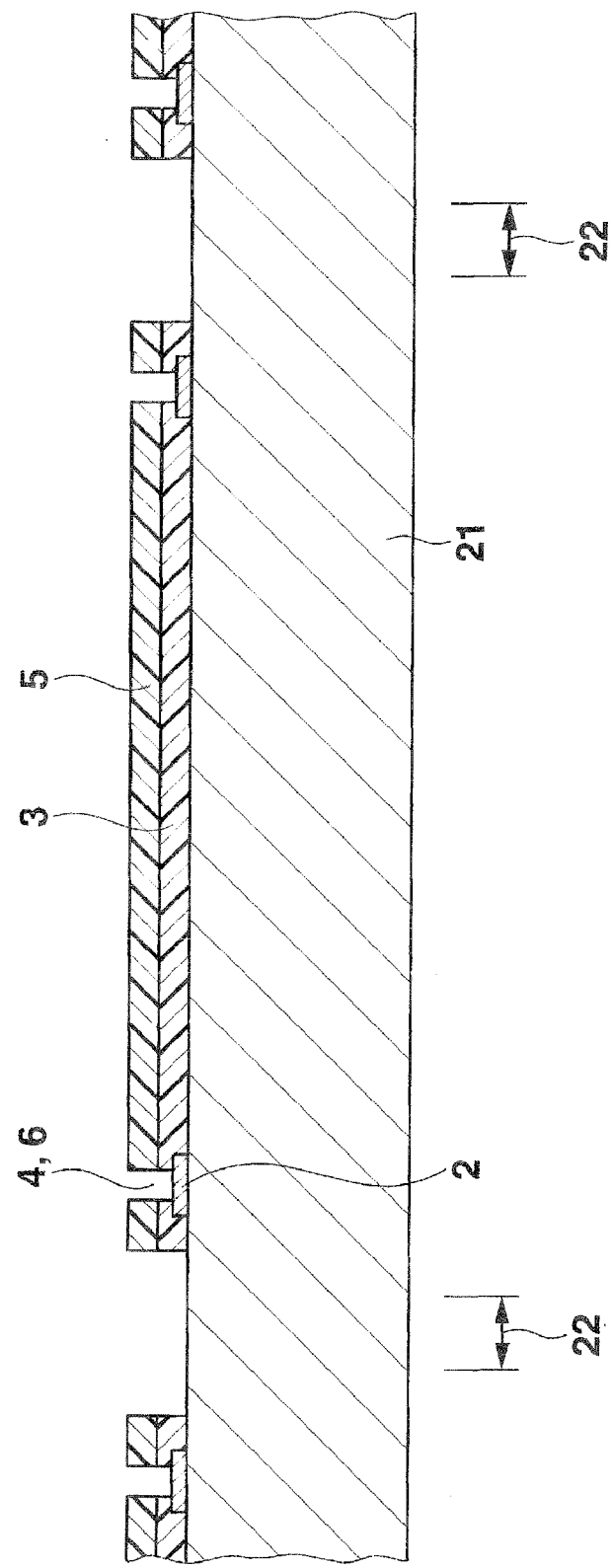
FIG. 16 is a sectional view of an initially prepared assembly in one example of a method of manufacturing the semiconductor device shown in FIG. 14 and FIG. 15.

In this case, the thickness of the semiconductor wafer 21 is greater than the thickness of a silicon substrate 1 shown in FIG. 15. In FIG. 16, zones indicated by the sign 22 are dicing streets. The parts of the passivation film 3 and the protective film 5 corresponding to the dicing street 22 and both its sides are removed.

Figure 17:
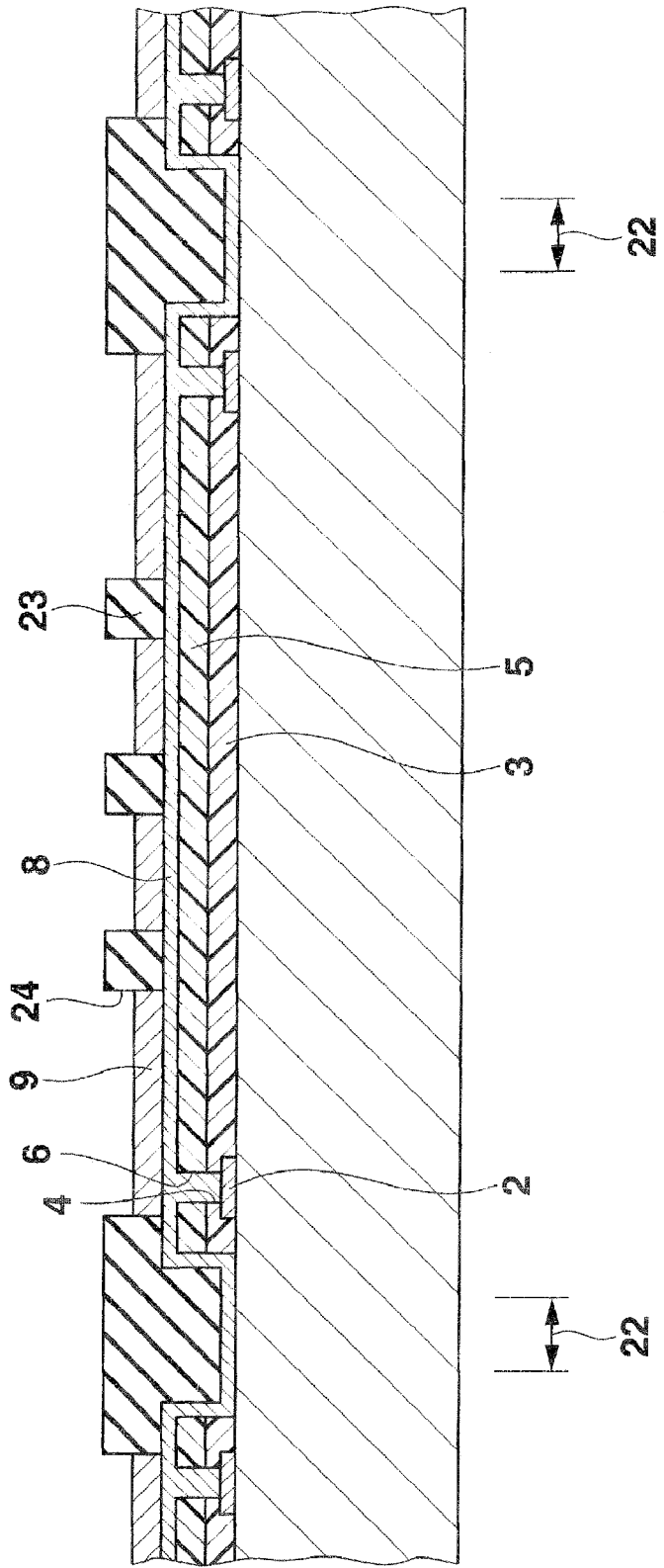
FIG. 17 is a sectional view of a step following FIG. 16.

Then, as shown in FIG. 17, a foundation metal layer 8 is formed on the upper surface of the first insulating film 5 including the upper surface of the connection pad 2 exposed through the openings 4 and 6 of the passivation film 3 and the first insulating film 5, and on parts of the upper surface of the semiconductor wafer 21 corresponding to the dicing street 22 and both its sides. In this case, the foundation metal layer 8 may only be a copper layer formed by electroless plating, may only be a copper layer formed by sputtering, or may be a copper layer formed by sputtering on a thin film layer of, for example, titanium formed by sputtering.

Then, a plating resist film 23 made of a positive liquid resist is patterned/formed on the upper surface of the foundation metal layer 8. In this case, an opening 24 is formed in a part of the plating resist film 23 corresponding to a region where an upper metal layer 9 is to be formed. Further, electrolytic plating with copper is carried out using the foundation metal layer 8 as a plating current path, thereby forming the upper metal layer 9 on the upper surface of the foundation metal layer 8 within the opening 24 of the plating resist film 23. Further, the plating resist film 23 is released.

Figure 18:
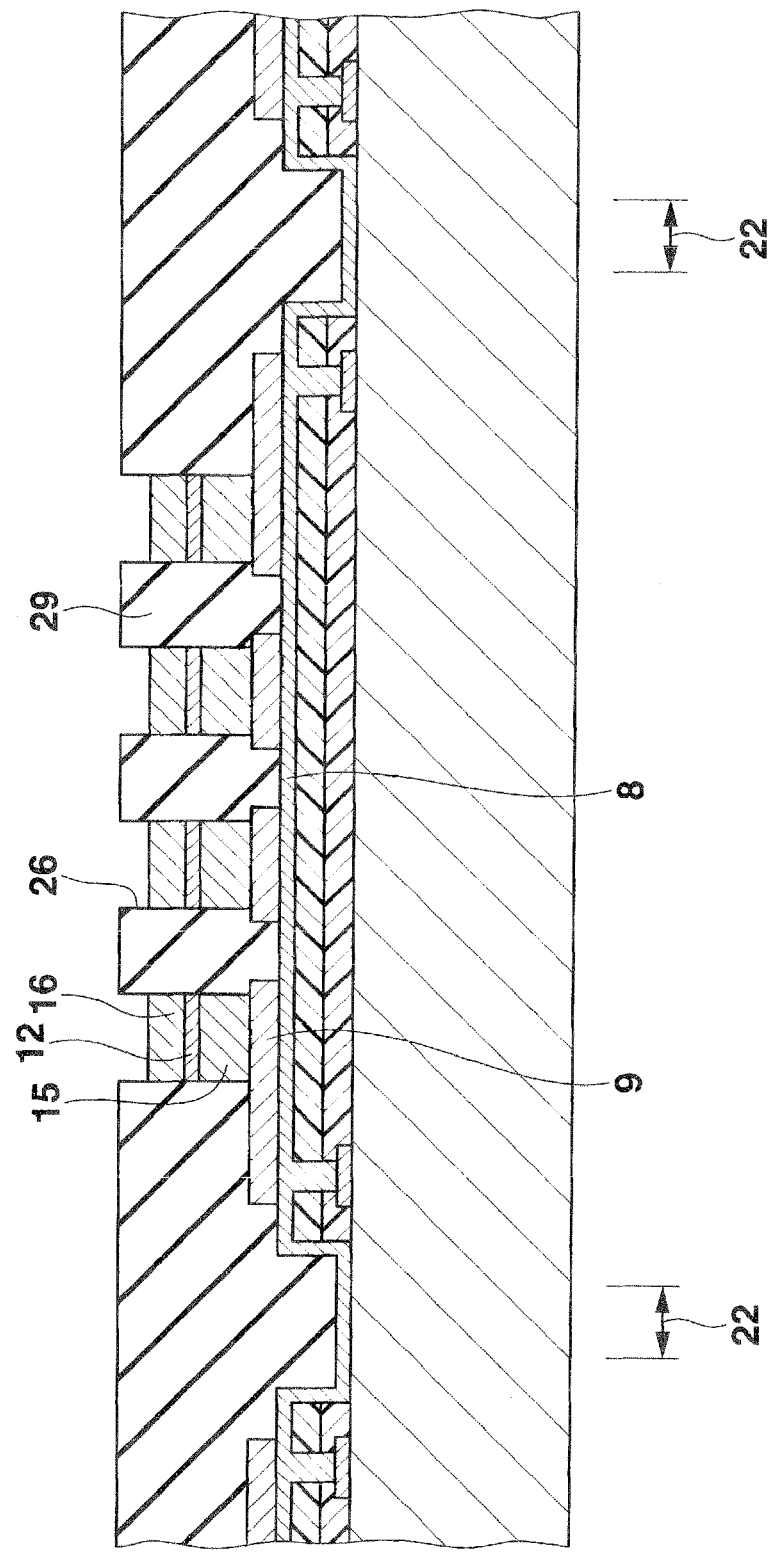
FIG. 18 is a sectional view of a step following FIG. 17.

Then, as shown in FIG. 18, a plating resist film 29 made of a negative liquid resist is patterned/formed on the upper surface of the foundation metal layer 8 including the upper metal layer 9. In this case, an opening 26 is formed in a part of the plating resist film 29 corresponding to a land 7b of the upper metal layer 9 (a region where a columnar electrode 15 and the like are to be formed). Further, electrolytic plating with copper, nickel, and solder is sequentially carried out using the foundation metal layer 8 as a plating current path in this order, so that the columnar electrode (copper layer) 15, a tin diffusion inhibiting layer 12, and an oxidation inhibiting layer 16 are formed in this order on the upper surface of the land 7b of the upper metal layer 9 within the opening 26 of the plating resist film 29.

The columnar electrode 15 eases stress when the semiconductor device shown in FIG. 14 is mounted on a printed circuit board (not shown). The height of the columnar electrode 15 is, for example, 100 μm. The tin diffusion inhibiting layer 12 is made of nickel, and inhibits the diffusion of tin to the columnar electrode 15 made of copper. The thickness of the tin diffusion inhibiting layer 12 is greater than the thickness of the tin diffusion inhibiting layer 12 when formed by electroless plating, and is, for example, 5 to 10 μm. The oxidation inhibiting layer 16 is made of solder, and prevents the oxidization of the tin diffusion inhibiting layer 12. The thickness of the oxidation inhibiting layer 16 is, for example, 10 μm or more. In this case, as the upper side of the oxidation inhibiting layer 16 is ground in the subsequent process, the thickness of the oxidation inhibiting layer 16 is slightly greater than the thickness of the oxidation inhibiting layer 16 shown in FIG. 14. Here, if a gold layer is formed instead of the oxidation inhibiting layer 16, relatively expensive gold is used, and the upper side of this layer is ground in the subsequent process, resulting in a high cost. In contrast, if the oxidation inhibiting layer 16 made of relatively inexpensive solder is formed as in this invention, costs can be reduced.

Figure 19:
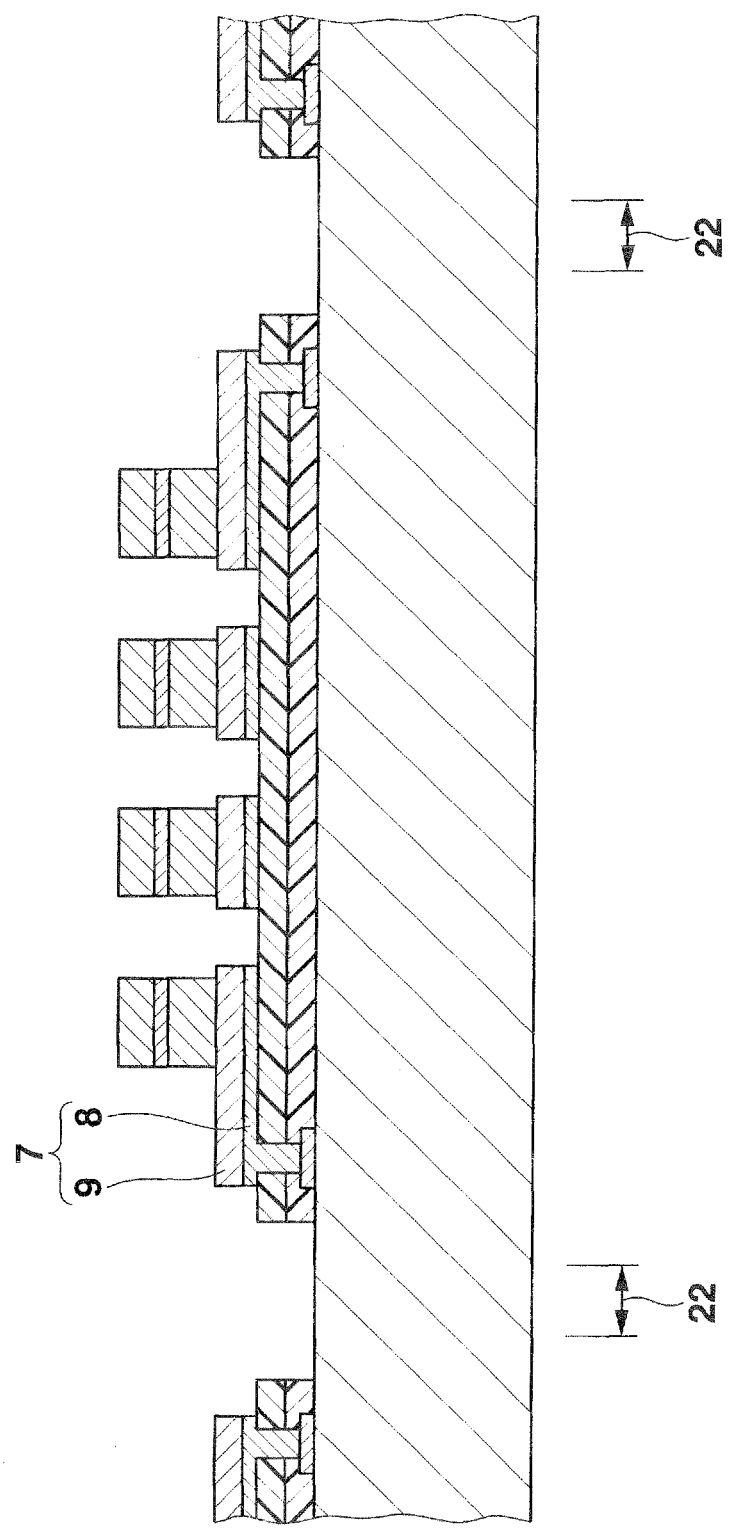
FIG. 19 is a sectional view of a step following FIG. 18.

Then, the plating resist film 29 is released. Further, using the upper metal layer 9 as a mask, the foundation metal layer 8 located in a part other than a part under the upper metal layer 9 is etched and removed. Thus, as shown in FIG. 19, the foundation metal layer 8 remains under the upper metal layer 9 alone. In this state, a wiring line 7 having a double-layer structure is formed by the upper metal layer 9 and the foundation metal layer 8 remaining thereunder.

Figure 20:
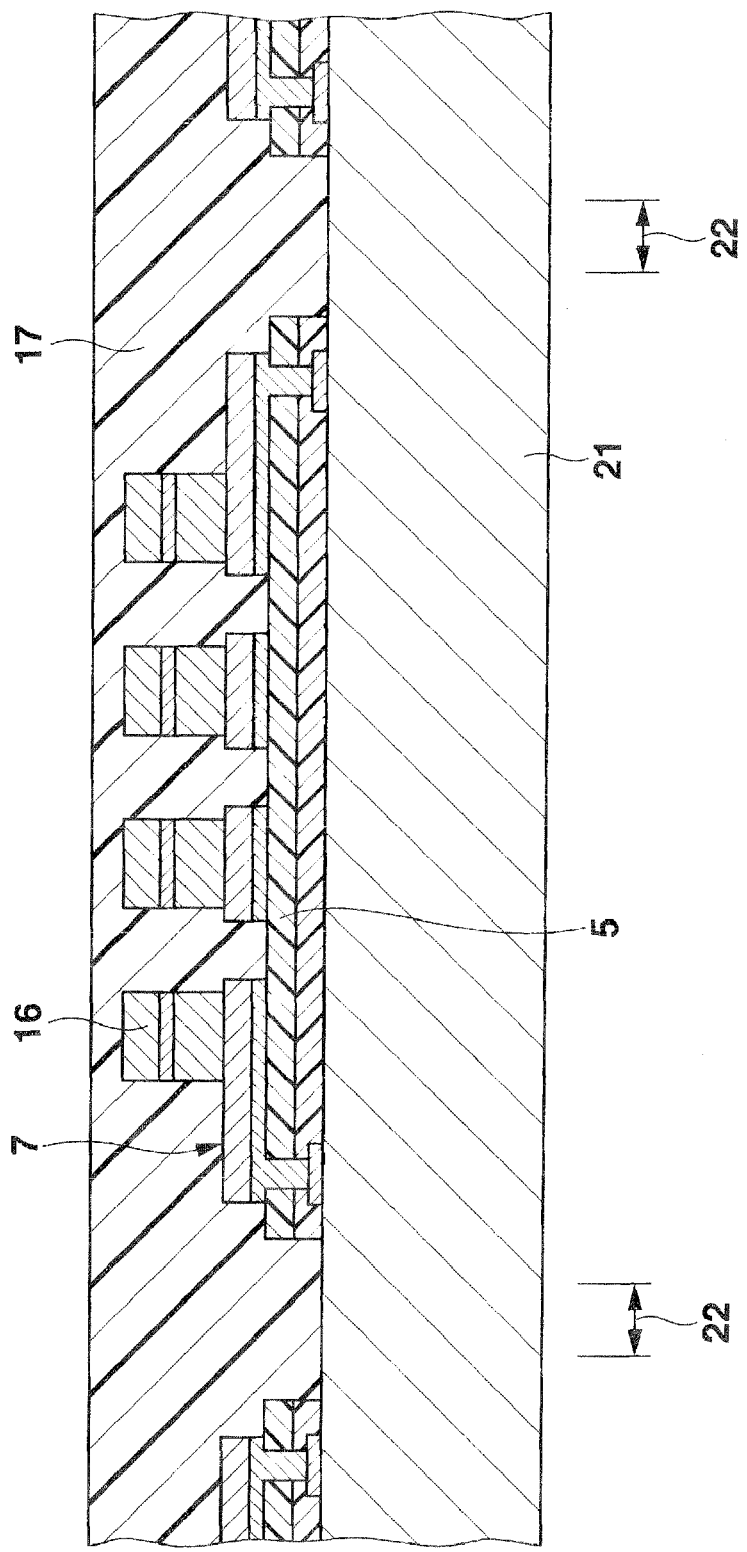
FIG. 20 is a sectional view of a step following FIG. 19.

Then, as shown in FIG. 20, a sealing film 17 made of an epoxy resin containing a silica filler is formed by a compression molding method or the printing method on the upper surface of the semiconductor wafer 21 corresponding to the dicing street 22 and both its sides and on the upper surface of the protective film 5 including the wiring line 7 and the oxidation inhibiting layer 16 so that the thickness of the sealing film 17 is slightly greater than the thickness of the oxidation inhibiting layer 16. Thus, in this condition, the upper surface of the oxidation inhibiting layer 16 is covered with the sealing film 17.

Figure 21:
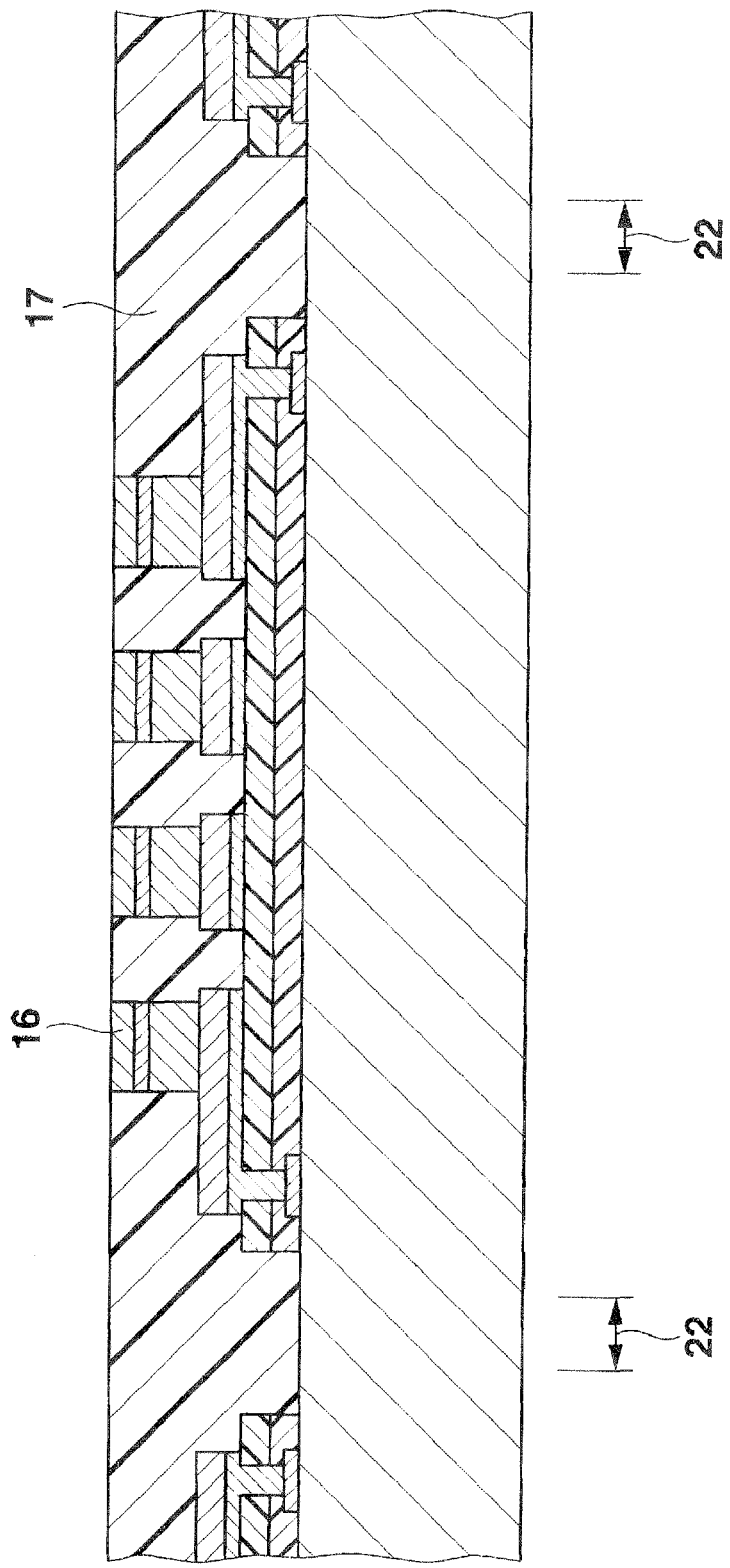
FIG. 21 is a sectional view of a step following FIG. 20.

Then, the upper sides of the sealing film 17 and the oxidation inhibiting layer 16 are properly ground to expose the upper surface of the oxidation inhibiting layer 16 as shown in FIG. 21, and the upper surface of the sealing film 17 including the exposed upper surface of the oxidation inhibiting layer 16 is planarized. Here, when the columnar electrode 15 made of copper is only formed on the upper surface of the land 7b of the upper metal layer 9, the upper side of the columnar electrode 15 is ground. Therefore, if grinding chips of copper adhere to the upper surface of the sealing film 17 around the columnar electrode 15, the process of removing the adhering grinding chips by light etching is needed. In contrast, when the upper side of the oxidation inhibiting layer 16 is ground, the grinding chips of solder adhering to the upper surface of the sealing film 17 around the oxidation inhibiting layer 16, if any, do not have to be removed as will be described later.

Figure 22:
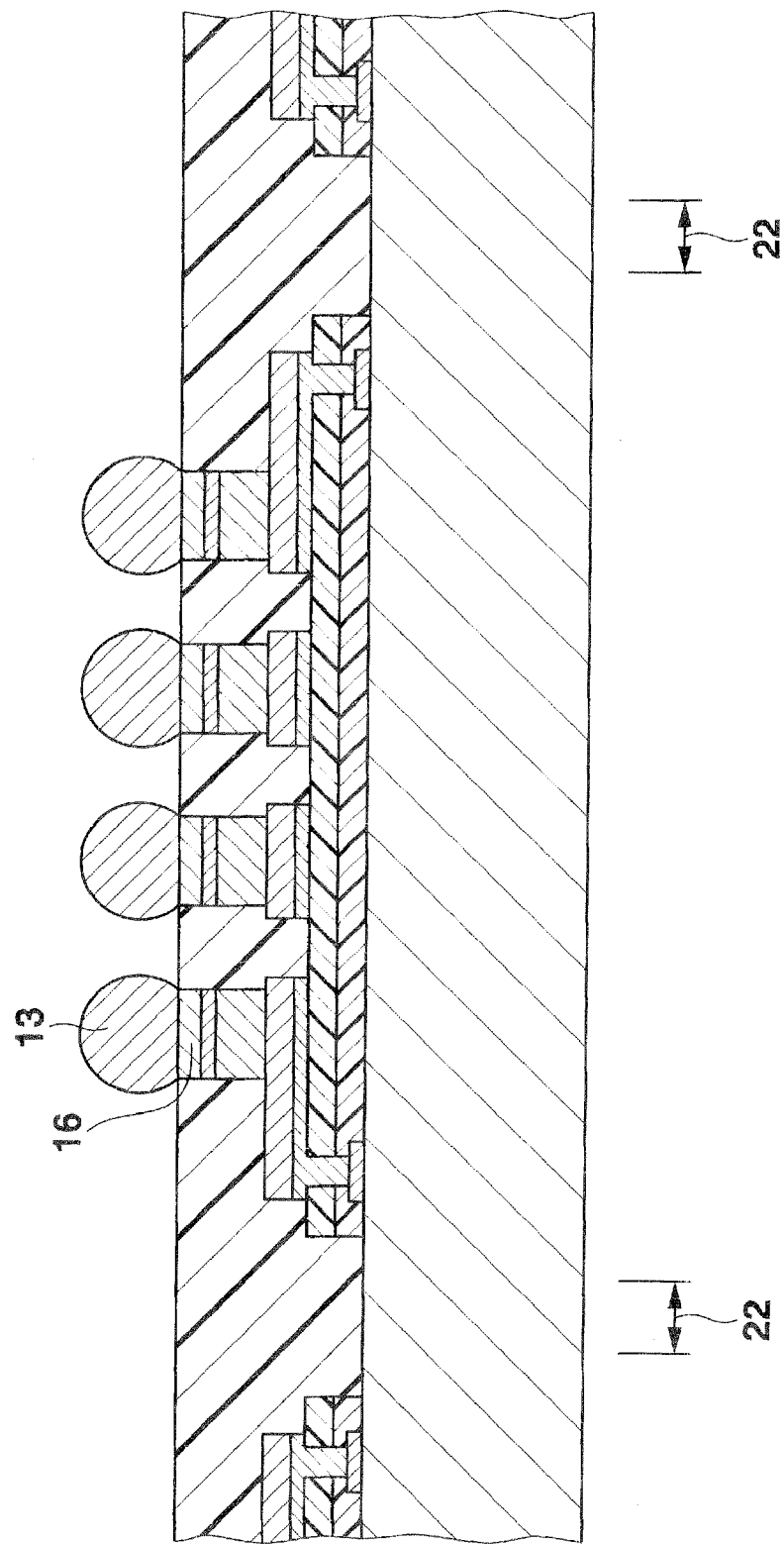
FIG. 22 is a sectional view of a step following FIG. 21.

Then, as shown in FIG. 22, a solder ball 13 is formed on the upper surface of the oxidation inhibiting layer 16. In order to form the solder ball 13, first, a solder paste is applied to the upper surface of the oxidation inhibiting layer 16, or a solder ball is mounted. Further, reflow is carried out to form the solder ball 13 on the upper surface of the oxidation inhibiting layer 16. In this case, as described above, the grinding chips of solder adhering to the upper surface of the sealing film 17 around the oxidation inhibiting layer 16, if any, do not have to be removed as described above because the adhering grinding chips are melted during the reflow and then combined with the solder ball 13 or the oxidation inhibiting layer 16.

Figure 23:
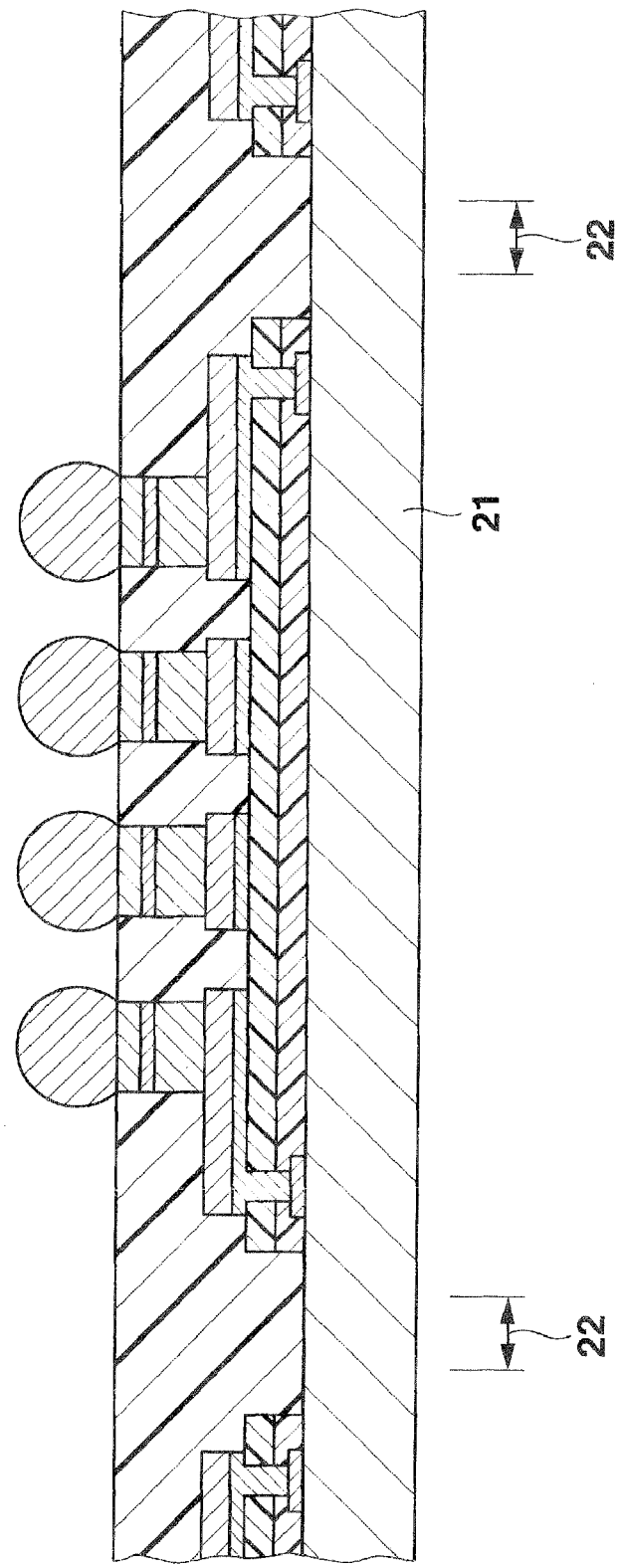
FIG. 23 is a sectional view of a step following FIG. 22.
Figure 24:
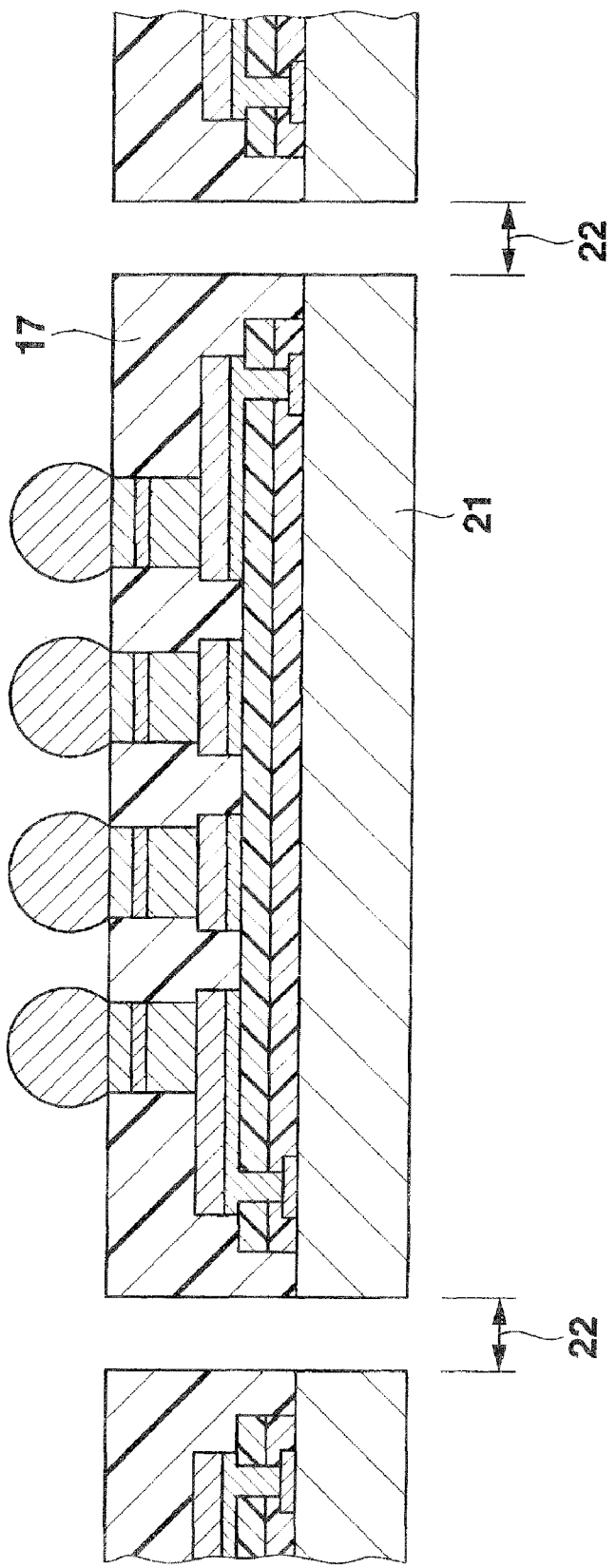
FIG. 24 is a sectional view of a step following FIG. 23.

Then, as shown in FIG. 23, the lower side of the semiconductor wafer 21 is properly ground to reduce the thickness of the semiconductor wafer 21. Further, as shown in FIG. 24, the sealing film 17 and the semiconductor wafer 21 are cut along the dicing streets 22, thereby obtaining the semiconductor devices shown in FIG. 13 and FIG. 15.

In the semiconductor device thus obtained, the tin diffusion inhibiting layer 12 for inhibiting the diffusion of tin in the solder ball 13 including the oxidation inhibiting layer 16 to the columnar electrode 15 is formed by electrolytic plating. Thus, the thickness of the tin diffusion inhibiting layer 12 can be greater than when the tin diffusion inhibiting layer 12 is formed by electroless plating. As a result, even when this semiconductor device is a power supply IC which deals with a high current, the diffusion of tin in the solder ball 13 including the oxidation inhibiting layer 16 to the columnar electrode 15 can be more inhibited.

(Third Embodiment)

Figure 25:
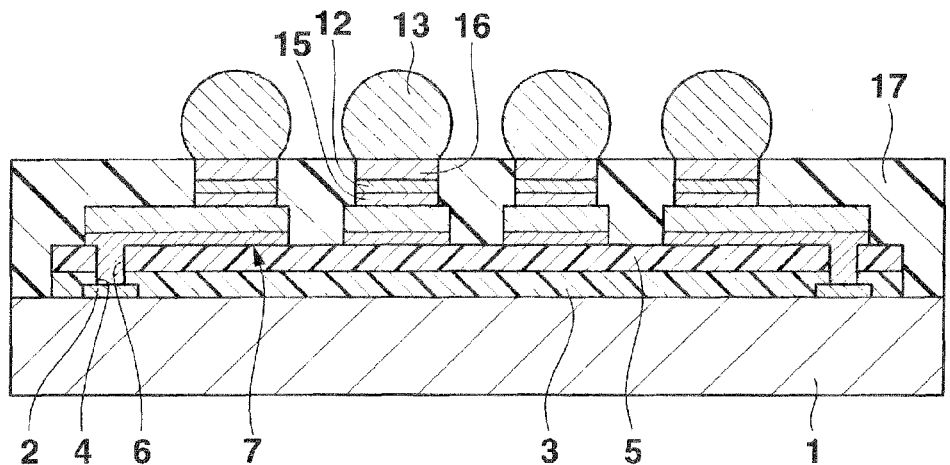
FIG. 25 is a plan view of a semiconductor device according to a third embodiment of the present invention.

FIG. 25 shows a sectional view of a semiconductor device according to a third embodiment of this invention. This semiconductor device is different from the semiconductor device shown in FIG. 15 in that the height of a columnar electrode (copper layer) 15 is reduced to, for example, about several μm. In this case, a sealing film (overcoat film) 17 may be initially formed by, for example, a polyimide resin in accordance with, for example, the spin coat method to cover the upper surface of an oxidation inhibiting layer 16. Therefore, in this case as well, the upper sides of the sealing film 17 and the oxidation inhibiting layer 16 are properly ground to expose the upper surface of the oxidation inhibiting layer 16.

(Fourth Embodiment)

Figure 26:
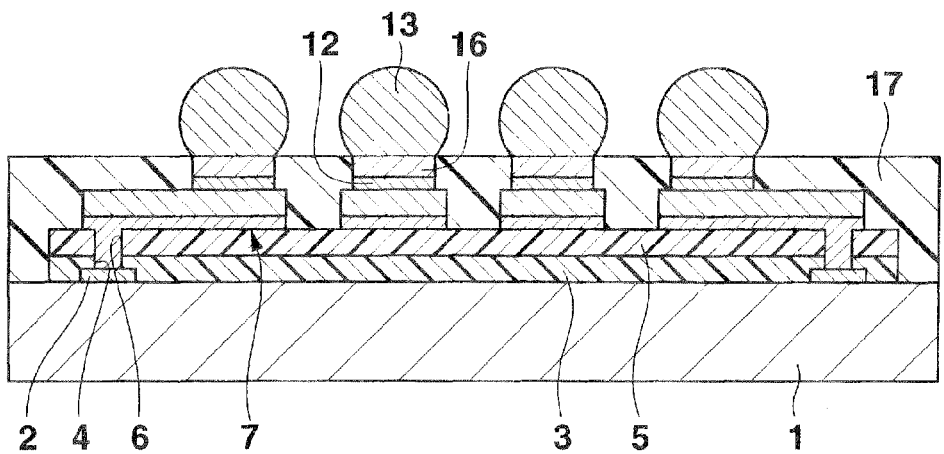
FIG. 26 is a plan view of a semiconductor device according to a fourth embodiment of the present invention.

FIG. 26 shows a sectional view of a semiconductor device according to a fourth embodiment of this invention. This semiconductor device is different from the semiconductor device shown in FIG. 15 in that no columnar electrode 15 is provided therein. In this case, a tin diffusion inhibiting layer 12 inhibits the diffusion of tin in a solder ball 13 including an oxidation inhibiting layer 16 to a wiring line 7 made of copper. In this case as well, a sealing film (overcoat film) 17 may be initially formed by, for example, a polyimide resin in accordance with, for example, the spin coat method to cover the upper surface of an oxidation inhibiting layer 16. Therefore, in this case as well, the upper sides of the sealing film 17 and the oxidation inhibiting layer 16 are properly ground to expose the upper surface of the oxidation inhibiting layer 16.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a connection pad provided on the semiconductor substrate;
   a wiring line connected with the connection pad;
   a tin diffusion inhibiting layer provided above the wiring line and includes a solder; and
   a solder bump provided on the tin diffusion inhibiting layer,
   wherein the melting point of the tin diffusion inhibiting layer is higher than the melting point of the solder bump.

2. The semiconductor device according to claim 1, further the wiring line comprising an overcoat film which is provided on an insulating film and which comprises an opening corresponding to a land of the wiring line.

3. The semiconductor device according to claim 1, wherein the tin diffusion inhibiting layer is formed by heating at 180° C. or more and 280° C. or less and is not remelted at 180° C. or more and 280° C. or less.

4. The semiconductor device according to claim 1, wherein the tin diffusion inhibiting layer is a melting point rising type solder.

5. The semiconductor device according to claim 4, wherein the melting point rising type solder includes a tin-copper-based lead-free solder having a noneutectic composition.

6. The semiconductor device according to claim 1, wherein the tin diffusion inhibiting layer includes a layer in which copper particles are dispersed into a thermosetting resin.

7. The semiconductor device according to claim 1, wherein the solder bump includes a melting point non-rising type solder.

8. The semiconductor device according to claim 7, wherein the melting point non-rising type solder includes a tin-silver-based lead-free solder having a eutectic composition.

9. The semiconductor device according to claim 1, wherein a copper layer is provided under the tin diffusion inhibiting layer on the land of the wiring line.

* * * * *